United States Patent
Ikehira et al.

(10) Patent No.: US 7,947,340 B2
(45) Date of Patent: May 24, 2011

(54) POLYMERIC LIGHT EMITTING SUBSTANCE AND POLYMER LIGHT EMITTING DEVICE USING THE SAME

(75) Inventors: Hideyuki Ikehira, Mukou (JP); Takahiro Ueoka, Tsukuba (JP); Shuji Doi, Tsukuba (JP); Yasuyuki Kurita, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 114 days.

(21) Appl. No.: 10/103,848

(22) Filed: Mar. 25, 2002

(65) Prior Publication Data

US 2002/0193532 A1 Dec. 19, 2002

(30) Foreign Application Priority Data

Mar. 27, 2001 (JP) ................................ 2001-089623
Sep. 28, 2001 (JP) ................................ 2001-302909

(51) Int. Cl.
*C09K 19/38* (2006.01)
*B32B 27/00* (2006.01)

(52) U.S. Cl. ........ 428/1.1; 428/35.7; 528/267; 528/230; 528/392; 528/398; 528/423

(58) Field of Classification Search ................. 428/35.7, 428/1.1; 528/267, 230, 392, 398, 423
See application file for complete search history.

(56) References Cited

U.S. PATENT DOCUMENTS

| | | | |
|---|---|---|---|
| 5,028,667 A * | 7/1991 | McLain et al. ................ | 525/415 |
| 5,414,069 A * | 5/1995 | Cumming et al. ............ | 528/310 |
| 5,442,021 A * | 8/1995 | Heiliger ........................ | 526/241 |
| 5,578,498 A * | 11/1996 | Singh et al. ................... | 436/518 |
| 5,580,527 A * | 12/1996 | Bell et al. .................... | 422/82.07 |
| 5,759,709 A * | 6/1998 | Doi et al. ...................... | 428/690 |
| 5,821,002 A * | 10/1998 | Ohnishi et al. ............... | 428/690 |
| 5,874,179 A * | 2/1999 | Kreuder et al. ............... | 428/690 |
| 5,876,864 A * | 3/1999 | Kim et al. ..................... | 428/690 |
| 5,891,975 A | 4/1999 | Chen et al. | |
| 5,965,118 A * | 10/1999 | Duncan et al. ............. | 424/78.27 |
| 6,114,463 A | 9/2000 | Chen et al. | |
| 6,403,236 B1 * | 6/2002 | Ohnishi et al. ............... | 428/690 |
| 6,461,747 B1 * | 10/2002 | Okada et al. ................. | 428/690 |
| 6,565,994 B2 * | 5/2003 | Igarashi ........................ | 428/690 |
| 2001/0015432 A1 | 8/2001 | Igarashi | |
| 2001/0019782 A1 | 9/2001 | Igarashi et al. | |
| 2001/0026879 A1 | 10/2001 | Chen et al. | |
| 2002/0027623 A1 | 3/2002 | Doi et al. | |
| 2002/0028349 A1 | 3/2002 | Seo | |
| 2002/0064681 A1 | 5/2002 | Takiguchi et al. | |
| 2002/0121638 A1 | 9/2002 | Grushin et al. | |
| 2004/0113124 A1 | 6/2004 | Christou et al. | |
| 2004/0137263 A1 | 7/2004 | Burn et al. | |
| 2004/0138455 A1 | 7/2004 | Stossel et al. | |
| 2005/0158581 A1 | 7/2005 | Fryd et al. | |

FOREIGN PATENT DOCUMENTS

| | | |
|---|---|---|
| DE | 197 26 472 A1 | 12/1998 |
| EP | 1 138 746 A1 | 10/2001 |
| JP | 08-245726 A | 9/1996 |
| JP | 08-269138 A | 10/1996 |
| JP | 10-101738 A | 4/1998 |
| JP | 10-231477 | 9/1998 |
| JP | 2000-204364 | 7/2000 |
| JP | 2001-247859 A | 9/2001 |
| JP | 2001-342459 A | 12/2001 |
| JP | 2002-141173 A | 5/2002 |
| JP | 2002-302671 A | 10/2002 |
| JP | 2003-146996 A | 5/2003 |
| JP | 2004-503059 T | 1/2004 |
| JP | 2004-526024 T | 8/2004 |
| JP | 2004-530254 T | 9/2004 |
| JP | 2004-531485 T | 10/2004 |
| JP | 2004-531850 T | 10/2004 |
| WO | WO 01/96454 A1 | 12/2001 |

OTHER PUBLICATIONS

Abstract, CA Accession No. 1998:336225 retrieved from CAPlus Database.
Y. Zhang et al., "A New Synthetic Route to the Preparation of a Series of Strong Photoreducing Agents: fac Tris-Ortho-Metalated Complexes of Iridium (III) with Substitute 2-Phenylpyridines", Inorg. Chem., vol. 30, 1991, pp. 1685-1687.
M. A. Baldo et al., "Very high-efficiency green organic light-emitting devices based on electrophosphorescence", Applied Physics Letters, vol. 75, No. 1, Jul. 5, 1999, pp. 4-6.
M. E. Thompson et al., "Phosphorescent Materials and Devices", Proceedings of the 10th International Workshop on Inorganic and Organic Electroluminescence (EL '00), Dec. 4-7, 2000, Hamamatsu, Japan, pp. 35-38.
O. Wennerström et al., "meso-Tetra(meso-Tetraphenylporphyrinyl)Porphyrin, a Macrocycle with Five Covalently Linked Porphyrin Units", Tetrahedron Letters, vol. 30, No. 9, 1989, pp. 1129-1132.
W. Huang et al., "The synthesis of perfluoroalkyl-substituted tetrakisphenylpro-phyrins", Chinese Journal of Chemistry, vol. 10, No. 2, 1992, pp. 175-179.
R. C. Kwong et al., "Efficient, Saturated Red Organic Light Emitting Devices Based on Phosphorescent Platinum (II) Porphyrins", Chem. Mater., vol. 11, 1999, pp. 3709-3713.

(Continued)

*Primary Examiner* — Marc A Patterson
(74) *Attorney, Agent, or Firm* — Sughrue Mion, PLLC

(57) ABSTRACT

A polymeric light emitting substance having a polystyrene reduced number-average molecular weight of from $10^3$ to $10^8$ wherein this light emitting substance has in the main chain or side chain a metal complex structure showing light emission from the triplet excited state, and said substance can form a light emitting layer by industrially simple application methods such as a spin coat method, inkjet method, printing method and the like.

18 Claims, No Drawings

OTHER PUBLICATIONS

M. Yang et al., "Monochromatic-Red-Light Emission of Novel Copolymers Containing Carbazole Units and Europium-Acrylate Complexes", J. Polym. Sci, Part A, vol. 38, 2000, pp. 3405-3411.

A. Farah et al., "Synthesis and characterization of partially crosslinked poly(N-vinylcarbazole-vinylalcohol) copolymers with polypyridyl Ru(II) luminophores: Potential materials for electroluminescence", Polymer Bulletin, vol. 43, 1999, pp. 135-142.

W. K. Chan et al., "Synthesis and electronic properties of conjugated polymers based on rhenium or ruthenium dipyridophenazine complexes", J. Mater. Chem., vol. 9, 1999, pp. 2103-2108.

P. K. Ng et al., "Design and Synthesis of Light Emitting Conjugated Polymers Functionalized with Transition Metal Complexes", Pol;ym. Prepr., vol. 40, 1999, pp. 1212-1213.

Patent Abstracts of Japan, vol. 1998, No. 14, Dec. 31, 1998.

Zhao, D. et al., "Organic Light-Emitting Diode Using $Eu^{3+}$ Polymer Complex as an Emitter", Jpn. J. Appl. Phys., vol. 38, 1999, pp. L46-L48.

Coudret, C. et al., "Electrophilic functionalization of a cyclometallated ruthenium complex, an easy entry to new organometallic synthons", Chem. Commun., 1998, pp. 663-664.

* cited by examiner

POLYMERIC LIGHT EMITTING SUBSTANCE AND POLYMER LIGHT EMITTING DEVICE USING THE SAME

BACKGROUND OF THE INVENTION

1. Field of the Invention

The present invention relates to a polymeric light emitting substance, a method of producing the same, a complex which can be a monomer used in producing the same, and a polymer light emitting device using this polymeric light emitting substance (hereinafter, referred to as polymer LED in some cases).

2. Description of the Related Art

Regarding light emitting materials used in a light emitting layer in a light emitting device, it is known that a device using in a light emitting layer a metal complex showing light emission from the triplet excited state (hereinafter, referred to as complex emitting triplet luminescence) has high light emitting efficiency.

As the complex emitting triplet luminescence, known are, for example, Ir(ppy) 3 containing iridium as a center metal (Appl. Phys. Lett., 75, 4 (1999)), PtOEP containing platinum as a center metal (Nature, 395, 151 (1998), Eu(TTA)3 phen containing europium as a center metal (Jpn. J. Appl. Phys., 34, 1883 (1995)) and the like.

However, for forming a light emitting layer using the above-mentioned known complex emitting triplet luminescence, there are usually only used methods such as a vacuum deposition method and the like, and it is difficult to form a light emitting layer by an application method.

An object of the present invention is to provide a novel light emitting substance having a complex emitting triplet luminescence structure in the molecule and capable of forming a light emitting layer by an application method, a method of producing the same, a novel complex which can be a monomer used in producing the same, and a polymer light emitting device using this polymeric light emitting substance.

SUMMARY OF THE INVENTION

The present inventors have intensively studied for solving the above-mentioned problems, and resultantly found that a polymeric light emitting substance having a polystyrene reduced number-average molecular weight of from $10^3$ to $10^8$ wherein this light emitting substance has in the main chain or side chain a metal complex structure showing light emission from the triplet excited state has a complex emitting triplet luminescence structure in the molecule, and a light emitting layer can be formed by an application method using this light emitting substance, leading to completion of the invention.

DETAILED DESCRIPTION OF THE INVENTION

The polymeric light emitting substance is a polymeric light emitting substance having a polystyrene reduced number-average molecular weight of from $10^3$ to $10^8$ wherein this light emitting substance has in the main chain or side chain a metal complex structure showing light emission from the triplet excited state, and particularly, it is preferable that the polymeric light emitting substance is a conjugated type polymeric light emitting substance.

Here, the conjugated type polymeric light emitting substance means a polymeric light emitting substance in which a de-localized π electron pair is present along the main chain skeleton of a polymer. Regarding this de-localized electron, an unpaired electron or lone electron pair may participate in resonance instead of a double bond, in some cases.

A complex emitting triplet luminescence which is a mother body of a metal complex structure showing light emission from the triplet excited state, in the present invention, will be described.

The complex emitting triplet luminescence is usually a heavy metal complex, and refers, for example, to a complex which can cause phosphorescence light emission from the above-mentioned complex. However, complexes providing observation of fluorescence light emission in addition to this phosphorescence light emission are also included.

The center metal of a complex emitting triplet luminescence is usually an atom having an atomic number of 50 or more, and is a metal manifesting a spin-orbital mutual action on this complex and showing a possibility of the intersystem crossing between the singlet state and the triplet state.

As the center metal of a complex emitting triplet luminescence, for example, rhenium, iridium, osmium, scandium, yttrium, platinum, gold, and europium such as lanthanoids, terbium, thulium, dysprosium, samarium, praseodymium, and the like, are listed, and iridium, platinum, gold and europium are preferable, iridium, platinum and gold are particularly preferable.

The ligand of a complex emitting triplet luminescence is usually an organic ligand, and the number of carbon atoms is usually from about 4 to 60.

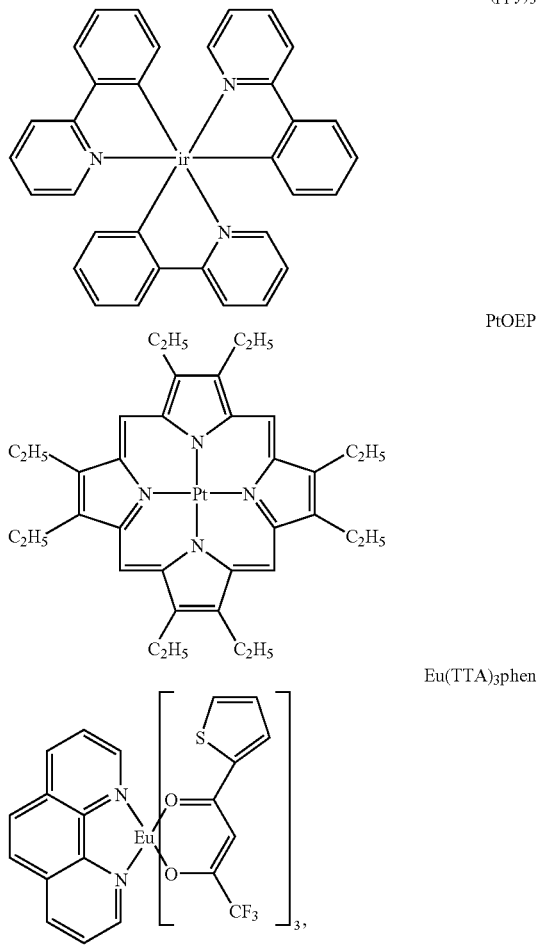

As the ligand of a complex emitting triplet luminescence, for example, 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, and the like are listed.

Examples of the complex emitting triplet luminescence include followings.

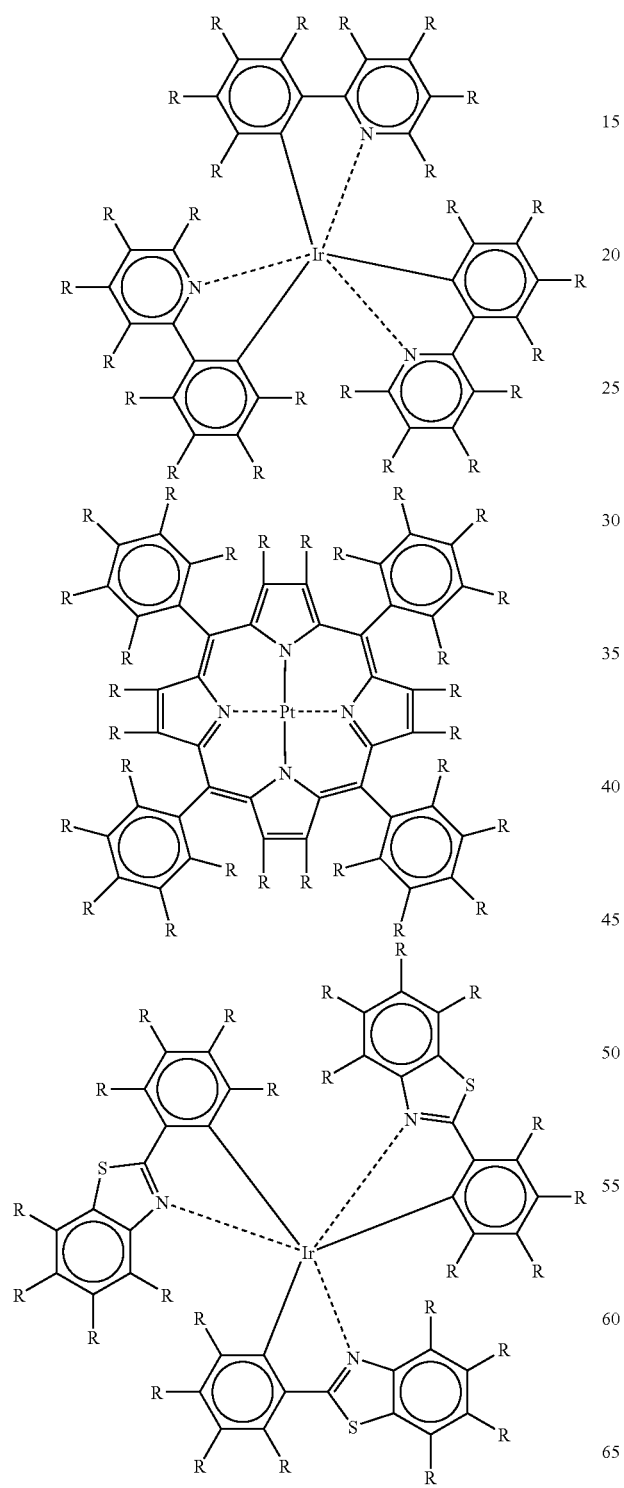

-continued

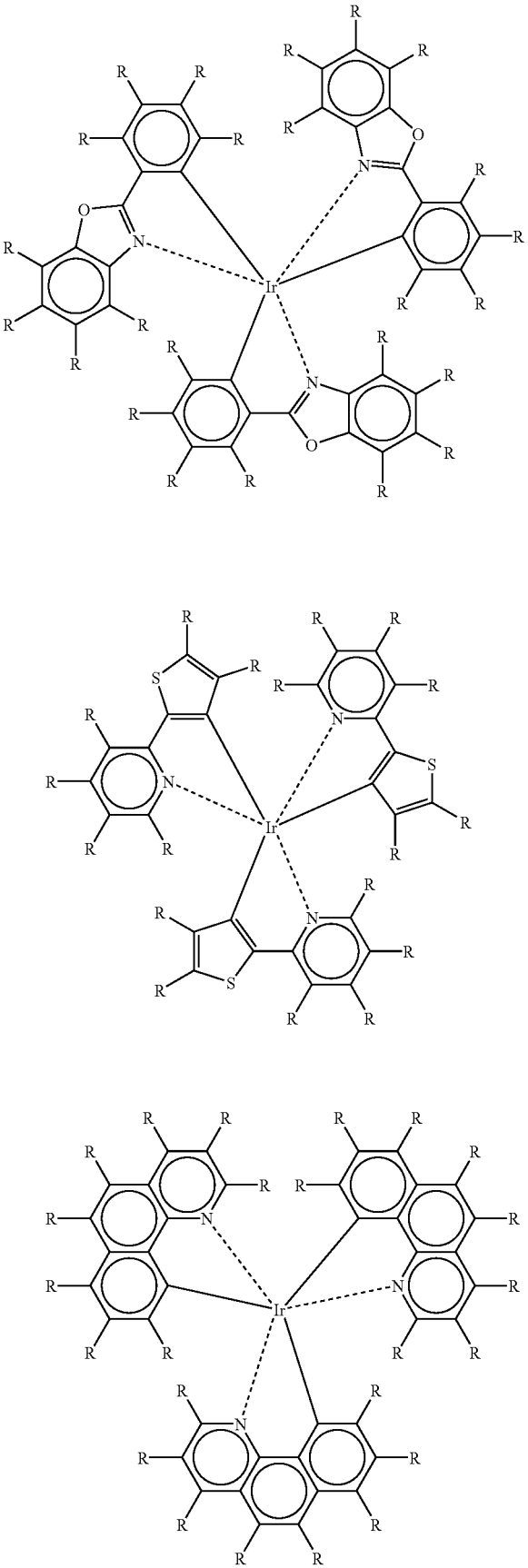

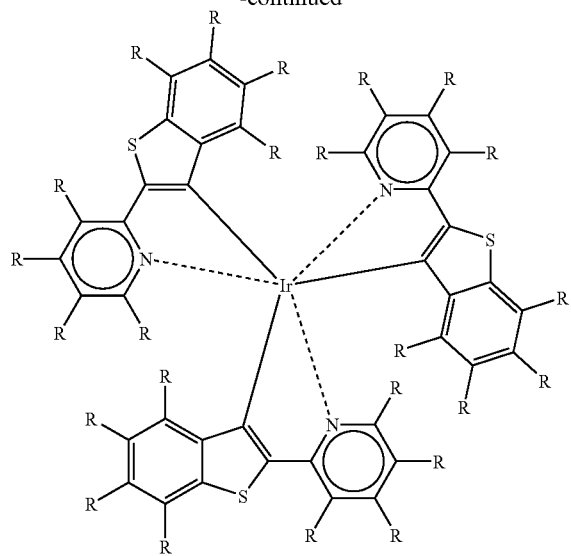
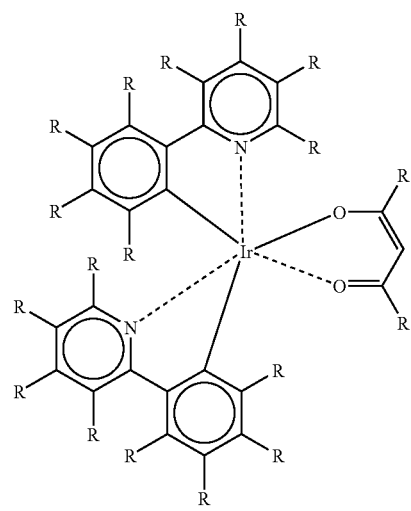
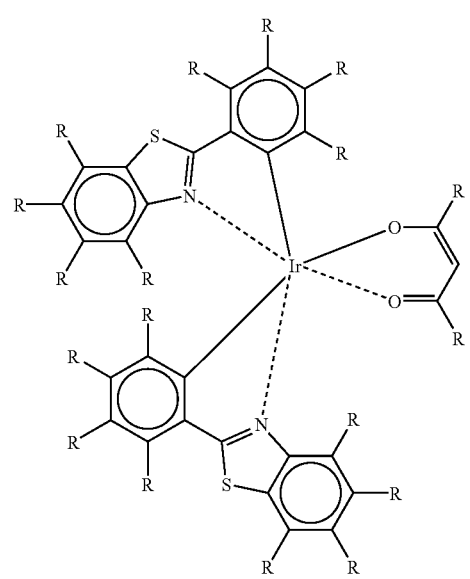
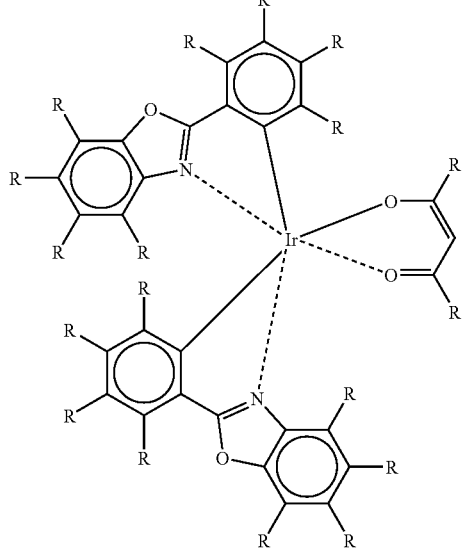
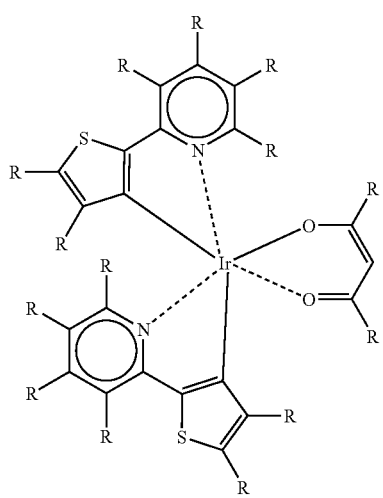
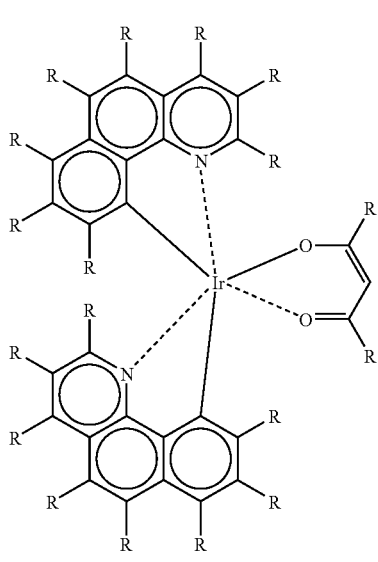

-continued

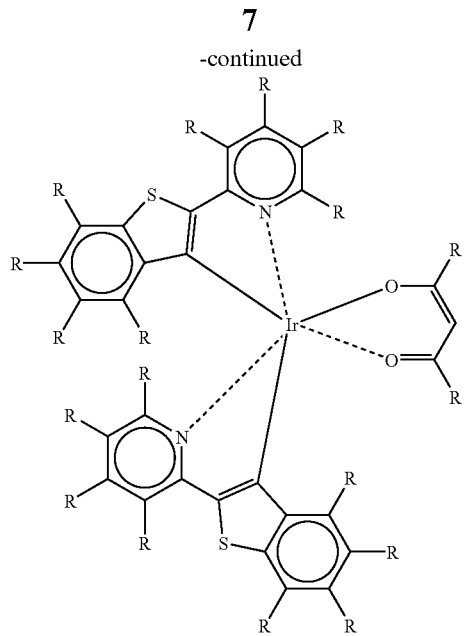

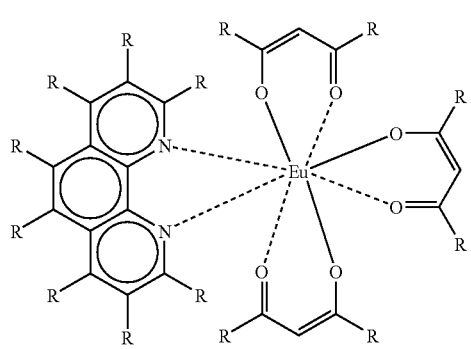

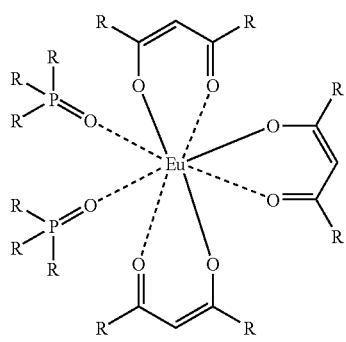

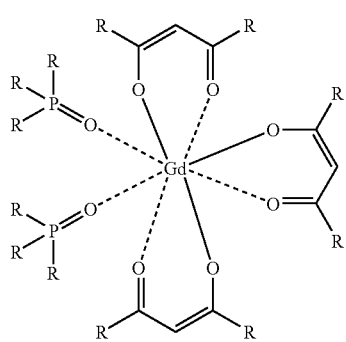

-continued

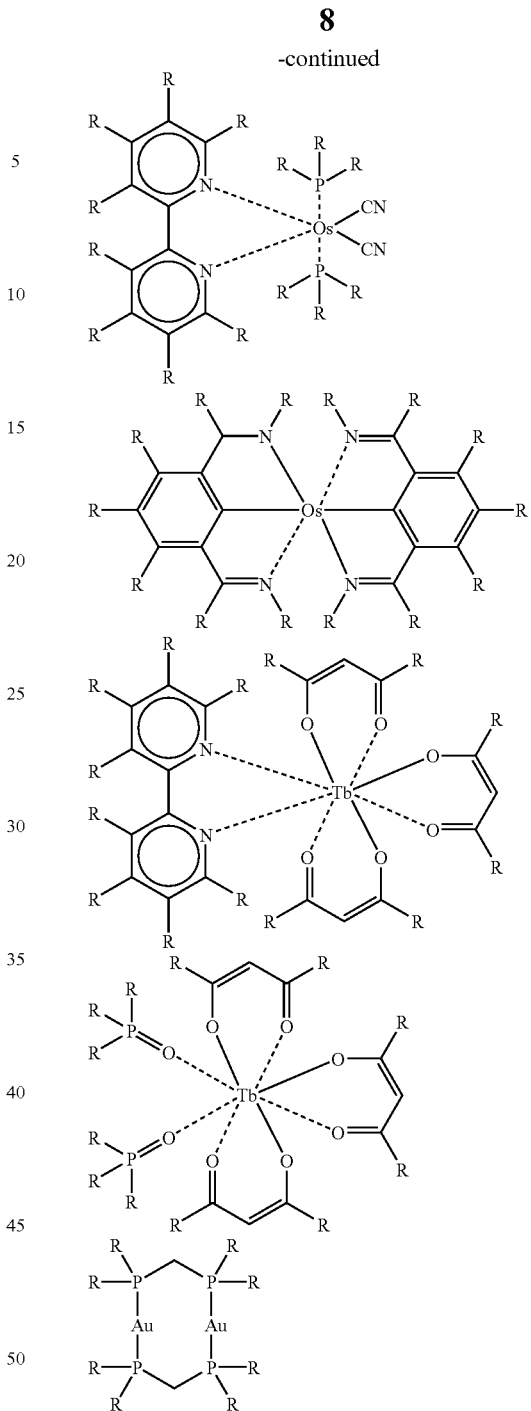

Here, R represents each independently a group selected from a hydrogen atom, alkyl group, alkoxy group, alkylthio group, alkylsilyl group, alkylamino group, aryl group, aryloxy group, arylalkyl group, arylalkoxy group, arylalkenyl group, aryl alkynyl group, arylamino group, monovalent heterocyclic compound group, and cyanno group. In order to improve the solubility in a solvent, it is preferable that the repeating unit including substituent has a form of little symmetry.

The alkyl group may be linear, branching or cyclic, and has usually about one to 20 carbon atoms. Examples thereof include specifically methyl group, ethyl group, propyl group, i-propyl group, butyl group, i-butyl group, t-butyl group, pentyl group, hexyl group, heptyl group, octyl group, 2-ethylhexyl group, nonyl group, decyl group, 3,7-dimethyloctyl group, lauryl group, etc. Among them, pentyl group, hexyl group, octyl group, 2-ethylhexyl group, decyl group, and 3,7-dimethyl octyl group are preferable.

The alkoxy group may be linear, branching or cyclic, and has usually about one to 20 carbon atoms. Examples thereof include specifically methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, deicyloxy group, 3,7-dimethyloctyloxy group, lauryloxy group etc. Among them, pentyloxy group, hexyloxy group, octyloxy group, 2-ethylhexyloxy group, decyloxy group, and 3,7-dimethyl octyloxy group are preferable.

The alkylthio group may be linear, branching or cyclic, and has usually about one to 20 carbon atoms. Examples thereof include specifically methylthio group, ethylthio group, propylthio group, and i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group etc. Among them, pentylthio group, hexylthio group, octylthio group, 2-ethylhexylthio group, decylthio group, and 3,7-dimethyloctylthio group are preferable.

The alkylsilyl group may be linear, branching or cyclic, and has usually about one to 60 carbon atoms. Examples thereof include specifically methylsilyl group, ethylsilyl group, propylsilyl group, and i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group, etc. Among them, pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyl-dimethylsilyl group, decyldimethylsilyl group, 3,7-dimethyloctyl-dimethylsilyl group are preferable.

The alkylamino group may be linear, branching or cyclic, and has usually about one to 40 carbon atoms. Either monoalkylamino group or dialkylamino group may be available. Examples thereof include specifically methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, etc. Among them, pentylamino group, hexylamino group, octylamino group, 2-ethylhexylamino group, decylamino group, and 3,7-dimethyloctylamino group are preferable.

The aryl group has usually about 6 to 60 carbon atoms. Examples thereof include phenyl group, $C_{1-12}$ alkoxyphenyl group ($C_{1-12}$ means that the number of carbon atoms is from 1 to 12), $C_{1-12}$ alkylphenyl group, 1-naphtyl group, 2-naphtyl group, etc. Among them, $C_{1-12}$ alkoxyphenyl group, and $C_{1-12}$ alkylphenyl group are preferable.

The aryloxy group has usually about 6 to 60 carbon atoms. Examples thereof include specifically, phenoxy group, $C_{1-12}$ alkoxyphenoxy group, $C_{1-12}$ alkylphenoxy group, 1-naphtyloxy group, 2-naphtyloxy group, etc. Among them, $C_{1-12}$alkoxyphenoxy group, and $C_{1-12}$ alkylphenoxy group are preferable.

The arylalkyl group has usually about 7 to 60 carbon atoms. Examples thereof include specifically, phenyl-$C_{1-12}$alkyl group, $C_{1-12}$ alkoxyphenyl $C_{1-12}$alkyl group, $C_{1-12}$ alkylphenyl-$C_{1-12}$alkyl group, 1-naphtyl-$C_{1-12}$alkyl group, 2-naphtyl-$C_{1-12}$ alkyl group, etc. Among them, $C_{1-12}$alkoxyphenyl-$C_{1-12}$alkyl group, and $C_{1-12}$alkylphenyl-$C_{1-12}$alkyl group are preferable.

The arylalkoxy group has usually about 7 to 60 carbon atoms. Examples thereof include specifically, phenyl-$C_{1-12}$alkoxy group, $C_{1-12}$alkoxyphenyl-$C_{1-12}$alkoxy group, $C_{1-12}$alkylphenyl-$C_{1-12}$alkoxy group, 1-naphtyl-$C_{1-12}$alkoxy group, 2-naphtyl-$C_{1-12}$alkoxy group, etc. Among them, $C_{1-12}$alkoxyphenyl-$C_{1-12}$alkoxy group, and $C_{1-12}$alkylphenyl-$C_{1-12}$alkoxy group are preferable.

The aryl alkenyl group has usually about 8 to 60 carbon atoms. Examples thereof include specifically, cis-phenyl alkenyl group, trans-phenyl alkenyl group, cis-tolyl alkenyl group, trans-tolyl alkenyl group, cis-1-naphtyl alkenyl group, trans-1-naphtyl alkenyl group, cis-2-naphtyl alkenyl group, trans-2-naphtyl alkenyl group, etc.

The aryl alkynyl group has usually about 8 to 60 carbon atoms. Examples thereof include specifically, phenyl alkynyl group, tolyl alkynyl group, 1-naphtyl alkynyl group, 2-naphtyl alkynyl group, etc.

The arylamino group has usually about 6 to 60 carbon atoms. Examples thereof include specifically, diphenylamino group, $C_{1-12}$alkoxyphenylamino group, di($C_{1-12}$alkoxyphenyl) amino group, di($C_{1-12}$ alkylphenyl)amino group, 1-naphtylamino group, 2-naphtylamino group, etc. Among them $C_{1-12}$alkylphenylamino group, and di($C_{1-12}$ alkylphenyl) amino group are preferable.

The monovalent heterocyclic compound group means an atomic group of a heterocyclic compound in which one hydrogen atom is removed, and has usually about 4 to 60 carbon atoms. Examples thereof include thienyl group, $C_{1-12}$alkylthienyl group, pyroryl group, furyl group, pyridyl group, $C_{1-12}$alkylpyridyl group, etc. Among them, thienyl group, $C_{1-12}$ alkylthienyl group, pyridyl group, and $C_{1-12}$alkylpyridyl group are preferable.

In order to improve the solubility of a polymeric light emitting substance in a solvent, it is suitable that at least one of the substituents contains an alkyl chain having cyclic or long chain structure. Examples thereof include cyclopentyl group, cyclohexyl group, pentyl group, hexyl group, octyl group, 2-ethylhexyl group, decyl group, and 3,7-dimethyloctyl group. Two of the alkyl chain terminals may be connected to form a ring. Moreover, a part of carbon atoms in the alkyl chain may be substituted by a group containing hetero atom, and examples of the hetero atom include an oxygen atom, a sulfur atom, a nitrogen atom, etc.

The aryl group and heterocyclic compound group in R may contain further one or more of substituents.

Complexes emitting triplet luminescence conventionally used are low molecular weight EL materials, which are disclosed in, for example: Nature, (1998), 395, 151; Appl. Phys. Lett. (1999), 75(1), 4; Proc. SPIE-Int. Soc. Opt. Eng. (2001), 4105 (Organic Light-Emitting Materials and Devices IV), 119; J. Am. Chem. Soc.,(2001),123,4304; Appl. Phys. Lett., (1997), 71 (18), 2596; Syn. Met., (1998), 94 (1), 103; Syn. Met., (1999), 99(2), 1361; and Adv. Mater., (1999), 11(10), 852.

The metal complex structure showing light emission from the triplet excited state indicates a structure derived from the above-mentioned complex emitting triplet luminescence.

The polymeric light emitting substance having in the main chain a metal complex structure showing light emission from the triplet excited state means a case in which the main chain of the light emitting substance has an aromatic ring or condensed ring thereof coordinated to a complex structure showing light emission from the triplet excited state, or has a metal.

The polymeric light emitting substance having in the side chain a metal complex structure showing light emission from the triplet excited state means a case in which an aromatic ring or condensed ring thereof coordinated to a complex structure showing light emission from the triplet excited state is connected to the main chain via an atom such as oxygen atom, sulfur atom, selenium atom, etc.; a direct bond such as a single bond, and double bond; or a divalent group such as methylene group, alkylene group, arylene group, etc.

One example of the mode of the present invention is a polymeric light emitting substance which contains two kinds or more of metal complex structures showing light emission from the triplet excited state. Each of the metal complex structures may have the same or different metals. Each of the metal complex structures may have the same or different emitting colors. For example, a polymer may contain both of metal complex structures one of which emits green and the other emits red. By designing the amount of the metal complex structures appropriately, the emitting color can be controlled, desirably.

In the polymeric light emitting substance of the present invention, the main chain preferably comprises a conjugated polymer.

Of polymeric light emitting substances of the present invention, preferable is a polymeric light emitting substance comprising one or more repeating units of the general formula (1) and one or more repeating units having a metal complex structure showing light emission from the triplet excited state:

(1)

(wherein, $Ar_1$ represents an arylene group or a divalent heterocyclic compound group. $R_1$ and $R_2$ each independently represent a hydrogen atom, alkyl group, aryl group, monovalent heterocyclic compound group or cyano group, n represents 0 or 1).

Of them, a polymeric light emitting substance wherein the amount of repeating units having a metal complex structure showing light emission from the triplet excited state is 0.01 molt or more and 10 molt or less based on the total amount of repeating units of the general formula (1) and repeating units having a metal complex structure showing light emission from the triplet excited state, is more preferable. When the amount of repeating units having a metal complex structure showing light emission from the triplet excited state is too large or too small, an effect of high light emission efficiency tends to lower.

As the repeating unit having a metal complex structure showing light emission from the triplet excited state, groups having bonding sites, remaining after removal of hydrogen atoms from the above-mentioned ligand of the complex emitting triplet luminescence, are exemplified.

As the repeating unit having a metal complex structure showing light emission from the triplet excited state, also listed are those in which the substituent of $Ar_1$ or, $R_1$ or $R_2$ in the above-mentioned repeating unit of the formula (1) is a monovalent group having a metal complex structure showing light emission from the triplet excited state. Preferable examples thereof are as follows.

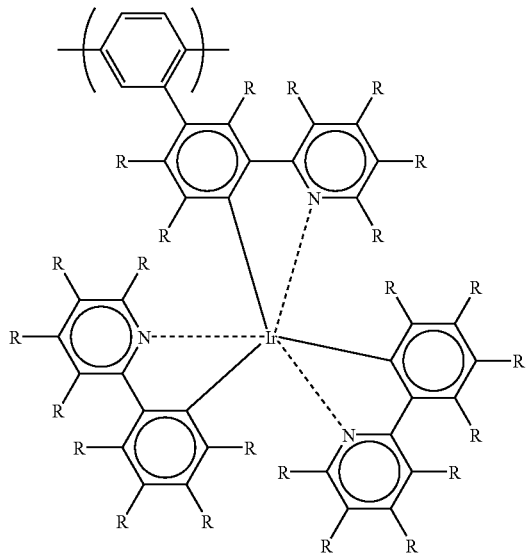

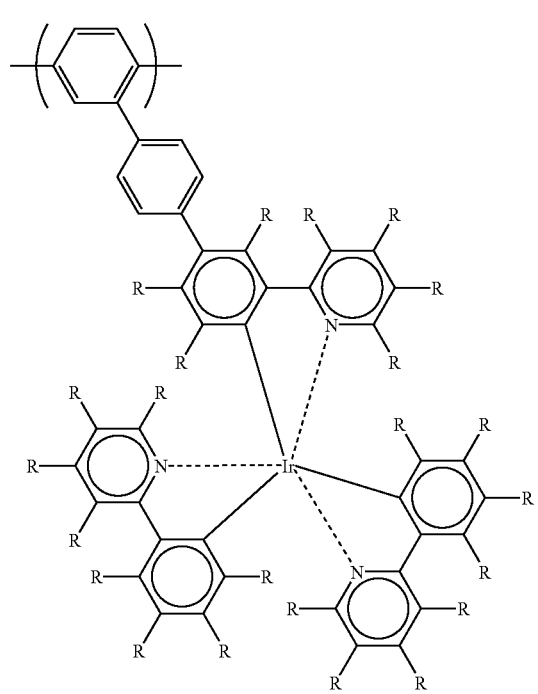

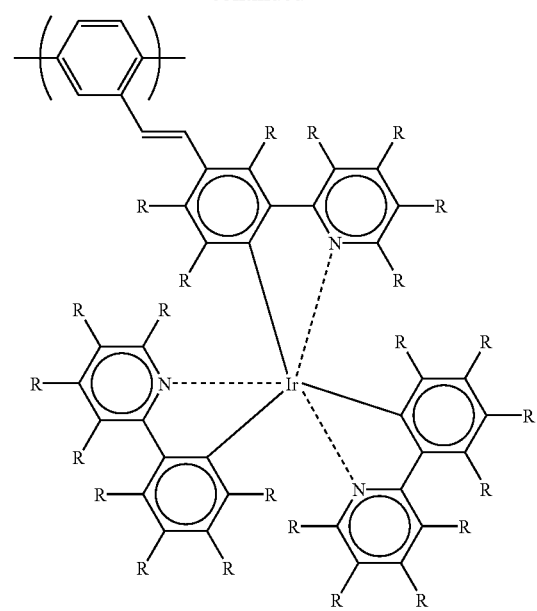
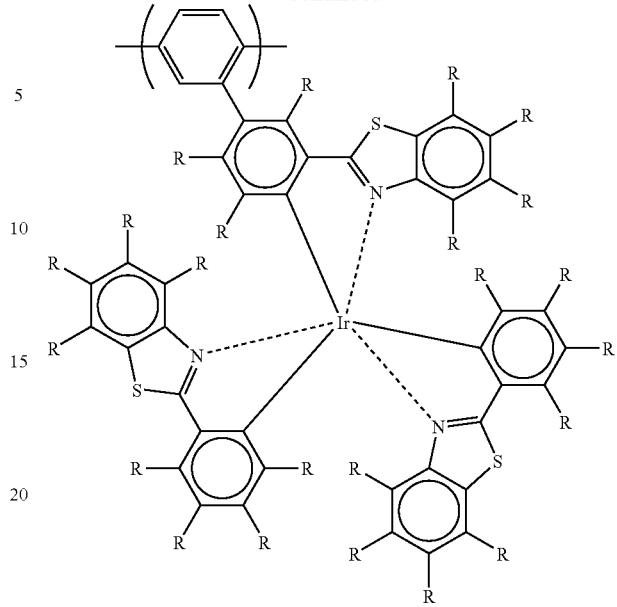
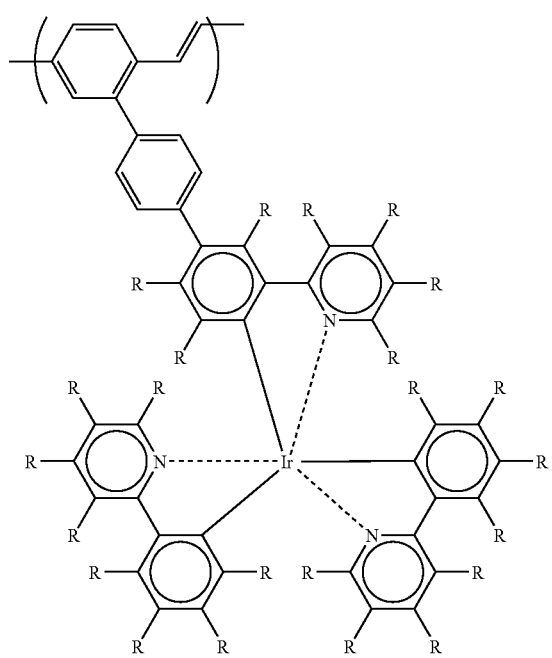
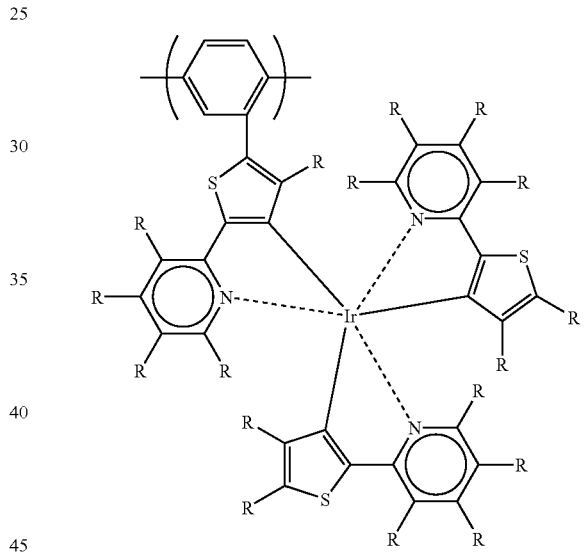
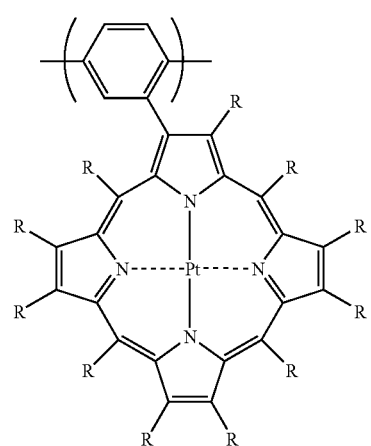
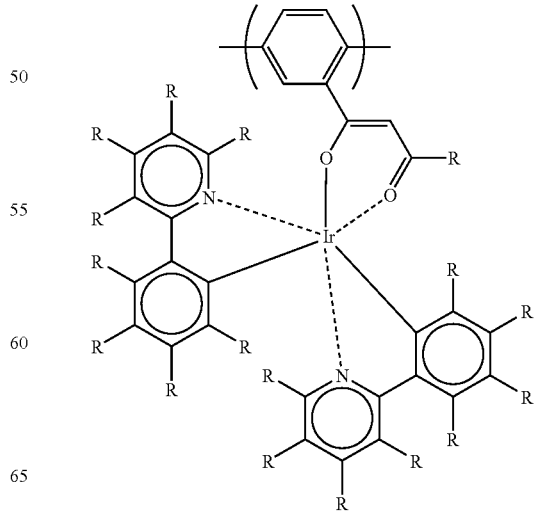

-continued

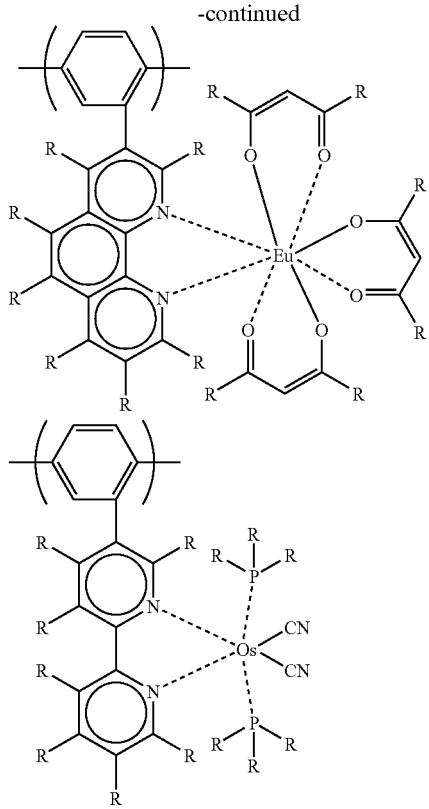

R is the same as above.

The monovalent group having a metal complex structure showing light emission from the triplet excited state is a group having one bonding site, remaining after removal of one hydrogen atom from the above-mentioned ligand of the complex emitting triplet luminescence.

The polymeric light emitting substance of the present invention may have a monovalent group in which the end of the main chain has a metal complex structure showing light emission from the triplet excited state.

In the general formula (1), $Ar_1$ means an arylene group or a divalent heterocyclic compound group. $Ar_1$ may have a substituent such as an alkyl group, alkoxy group, alkylthio group, alkylsilyl group, alkylamino group, aryl group, aryloxy group, arylalkyl group, arylalkoxy group, alylalkenyl group, arylalkynyl group, arylamono group, monovalent heterocyclic compound group or cyano group. Examples of the substituents are the same with the above R.

$Ar_1$ may be an arylene group or a divalent heterocyclic compound group contained in all materials conventionally used as an EL light emitting material. Monomers which do not inhibit the triplet luminescence are preferable. Examples of these materials are described in WO99/12989, WO00/55927, WO01/49769A1, WO01/49768A2, WO98/06773, U.S. Pat. No. 5,777,070, WO99/54385, WO00/46321 and U.S. Pat. No. 6,169,163B1.

In the present invention, the arylene group means a divalent group derived from an aromatic hydrocarbon having a benzene ring, a condensed ring, and those in which independent benzene rings and/or condensed rings are bonded directly or through groups such as vinylene.

The arylene group has usually 6 to 60 carbon atoms, preferably 6 to 20. Examples thereof include: phenylene groups (for example, the below structures of Nos. 1 to 3), naphthalenediyl groups (the below structures of Nos. 4 to 13), anthracenylene groups (the below structures of Nos. 14 to 19), biphenylene groups (the below structures of Nos. 20 to 25), triphenylene groups (the below structures of Nos. 26 to 28), stilbene-diyl (the below structures of A to D), distilbene-diyl (the below structures of E and F), condensed-ring compound groups (the below structures of Nos. 29 to 38), etc. Here, the number of carbon atoms of the substituent is not counted as the number of carbon atoms of the arylene group.

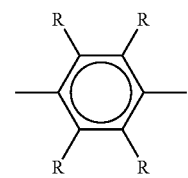

1

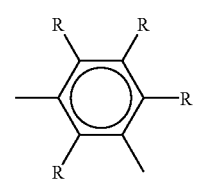

2

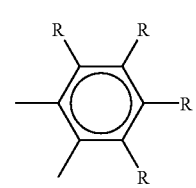

3

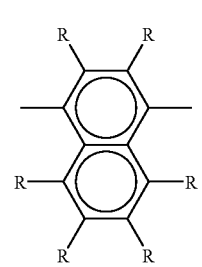

4

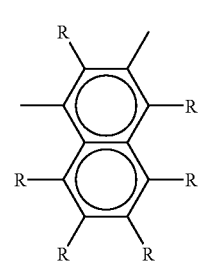

5

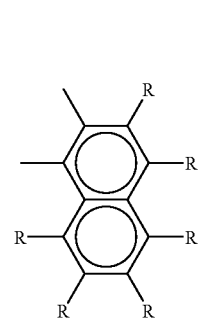

6

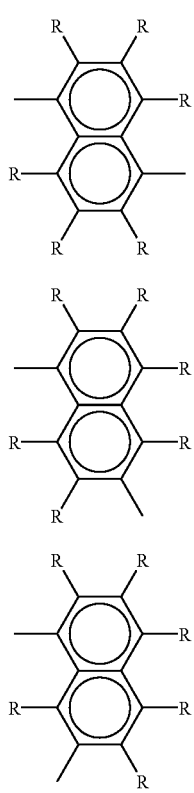
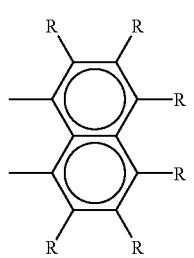
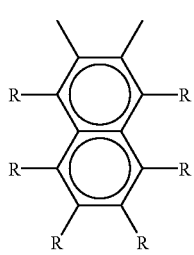
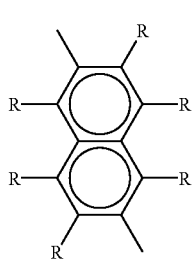
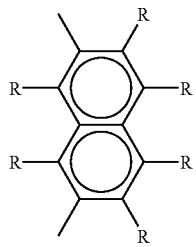
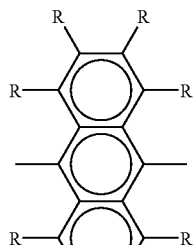
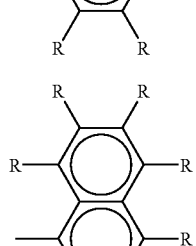
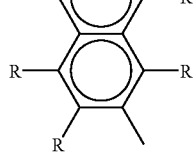
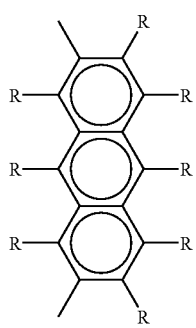
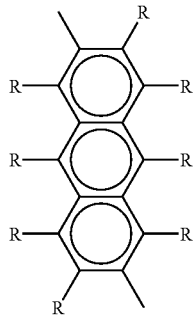

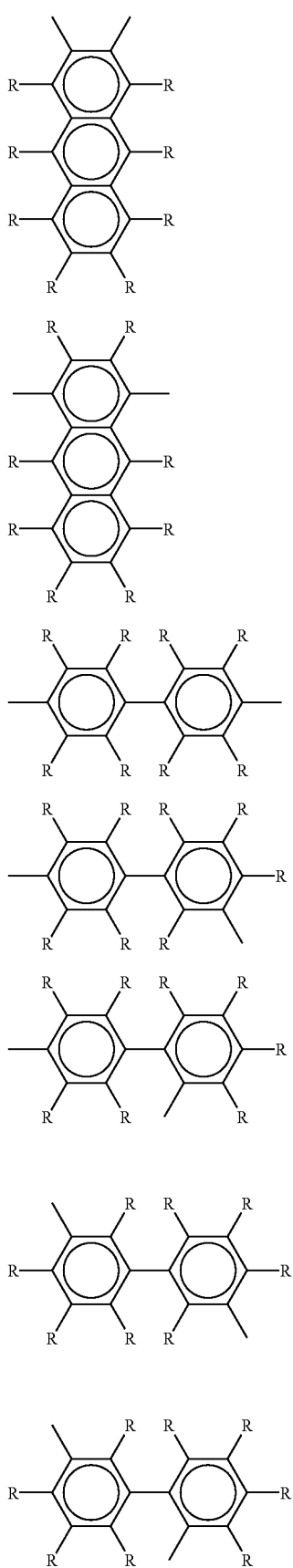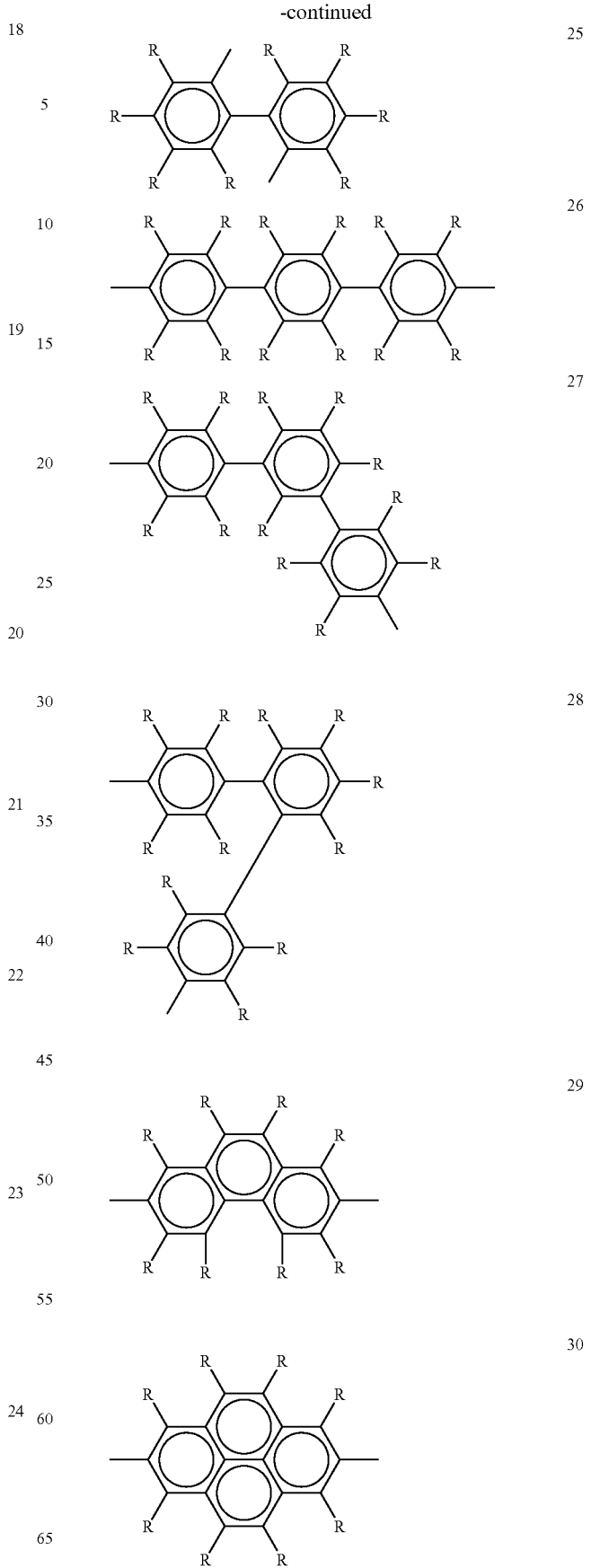

-continued

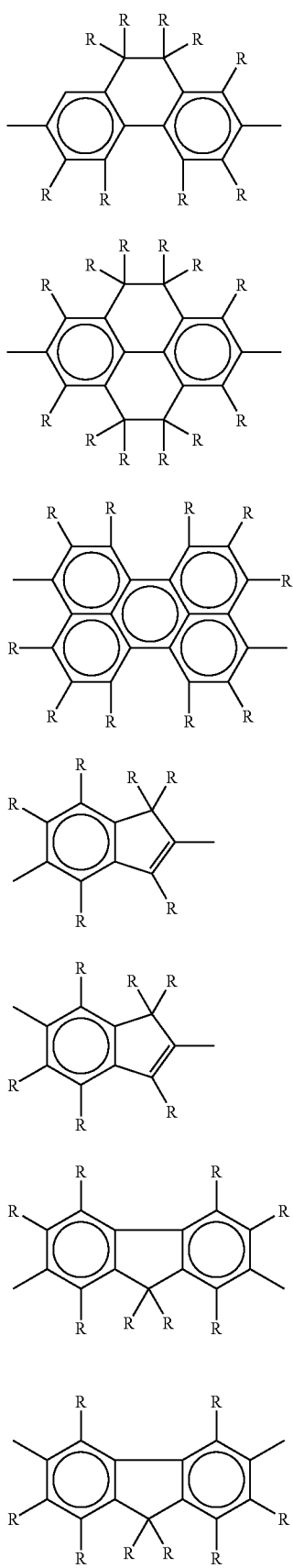

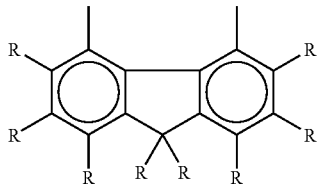

The divalent heterocyclic compound group means an atomic group of a heterocyclic compound in which two hydrogen atoms are removed, and has usually about 4 to 60, preferably 4 to 20 carbon atoms. Here, the number of carbon atoms of the substituent is not counted as the number of carbon atoms of the divalent heterocyclic compound group.

Here, the heterocyclic compound means that an organic compound having a cyclic structure in which at least one heteroatom such as oxygen, sulfur, nitrogen, phosphor, boron, etc. is contained in the cyclic structure as the element other than carbon atoms.

Examples of the divalent heterocyclic compound group include the followings.

Divalent heterocyclic compound groups containing nitrogen as the heteroatom, such as: pyridine-diyl groups (the below structures of Nos. 39 to 44), diazaphenylene groups (the below structures of Nos. 45 to 48), quinolinediyl groups (the below structures of Nos. 49 to 63), quinoxalinediyl groups (the below structures of Nos. 64 to 68), acridinediyl groups (the below structures of Nos. 69 to 72), bipyridyldiyl groups (the below structures of Nos. 73 to 75), phenanthrolinediyl groups (the below structures of Nos. 76 to 78), etc.; groups having fluorene structure containing silicon, nitrogen, sulfur, selenium, etc. as the hetero atom (the below structures of Nos. 79 to 93). In view of light emitting efficiency, preferable are carbazoles represented by formulae 82 to 84 containing a nitrogen atom or those having an aromatic amine monomer such as triphenyldiyl.

Exemplified are 5-membered-ring heterocyclic compound groups containing silicon, nitrogen, sulfur, selenium, etc. as the heteroatom (below structures of Nos. 94 to 98).

Exemplified are 5-membered-ring condensed heterocyclic compound groups containing silicon, nitrogen, sulfur, selenium, etc. as the heteroatom (below structures of Nos. 99 to 109), benzodiazole, benzooxadiazole-4,7-diyl, etc.

Exemplified are groups of 5-membered-ring heterocyclic compound groups containing silicon, nitrogen, sulfur, selenium, etc. as the heteroatom which form dimer or oligomer by bonding at á-position of the hetero atom (below structures of Nos. 110 to 118).

Exemplified are groups of 5-membered-ring heterocyclic compound groups containing silicon, nitrogen, sulfur, selenium, etc. as the heteroatom which bond to a phenyl group at á-position of the hetero atom (below structures of Nos. 112-118).

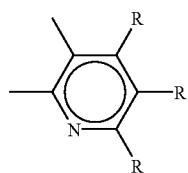

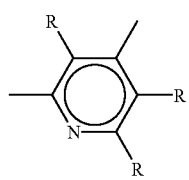
40
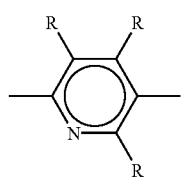
41
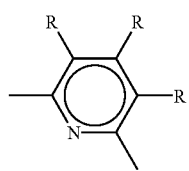
42
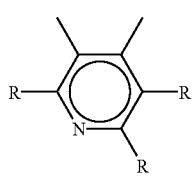
43
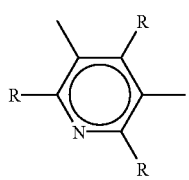
44
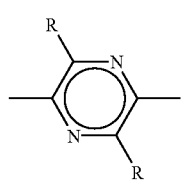
45
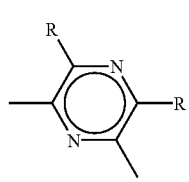
46
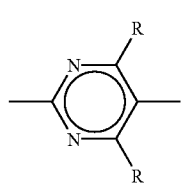
47
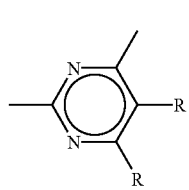
48
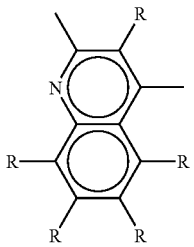
49
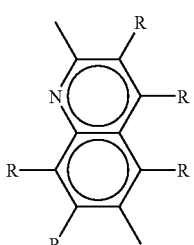
50
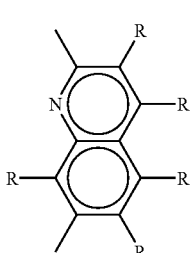
51
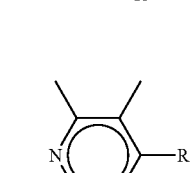
52
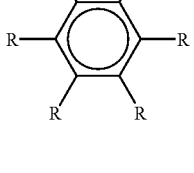
53
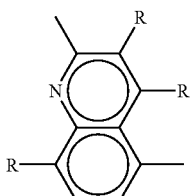
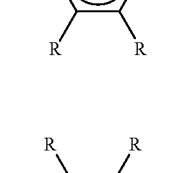
54
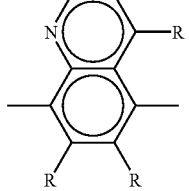

55
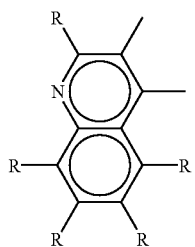
56
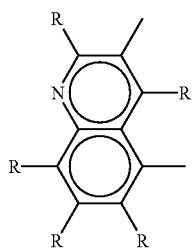
57
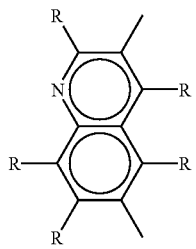
58
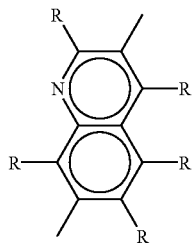
59
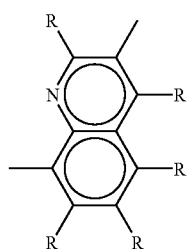
60
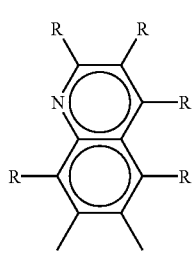
61
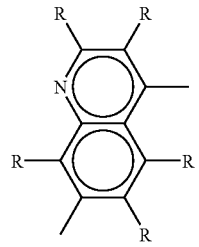
62
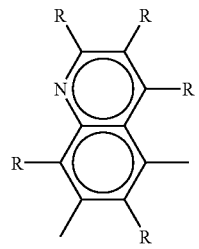
63
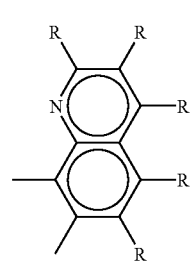
64
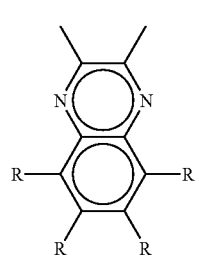
65
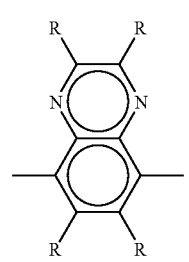
66
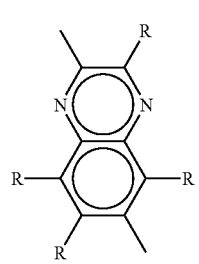

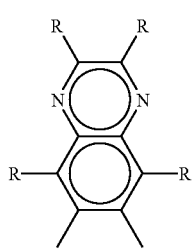
67
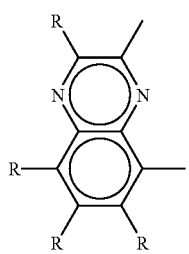
68
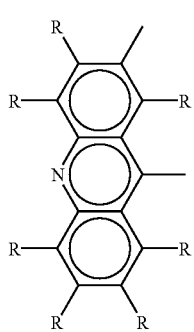
69
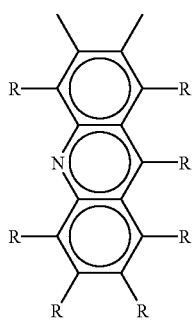
70
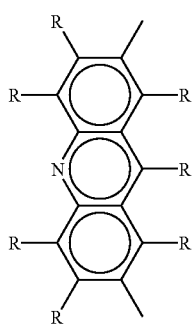
71
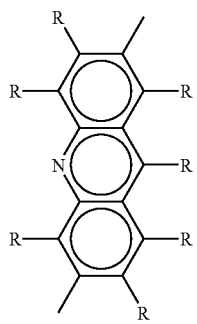
72
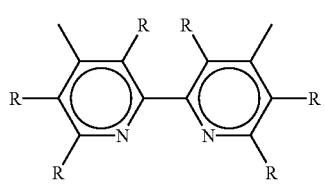
73
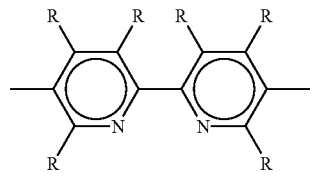
74
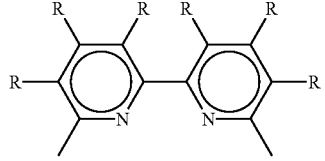
75
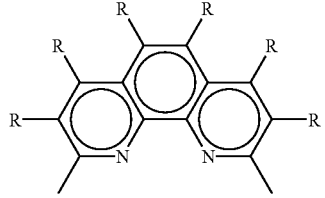
76
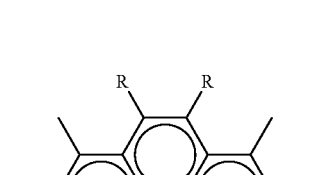
77
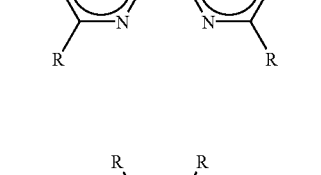
78
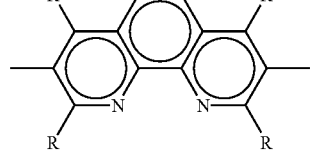

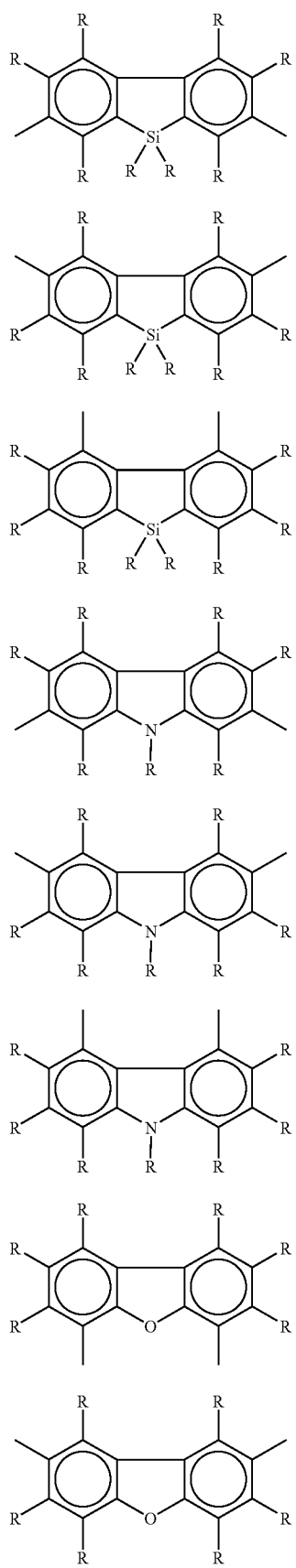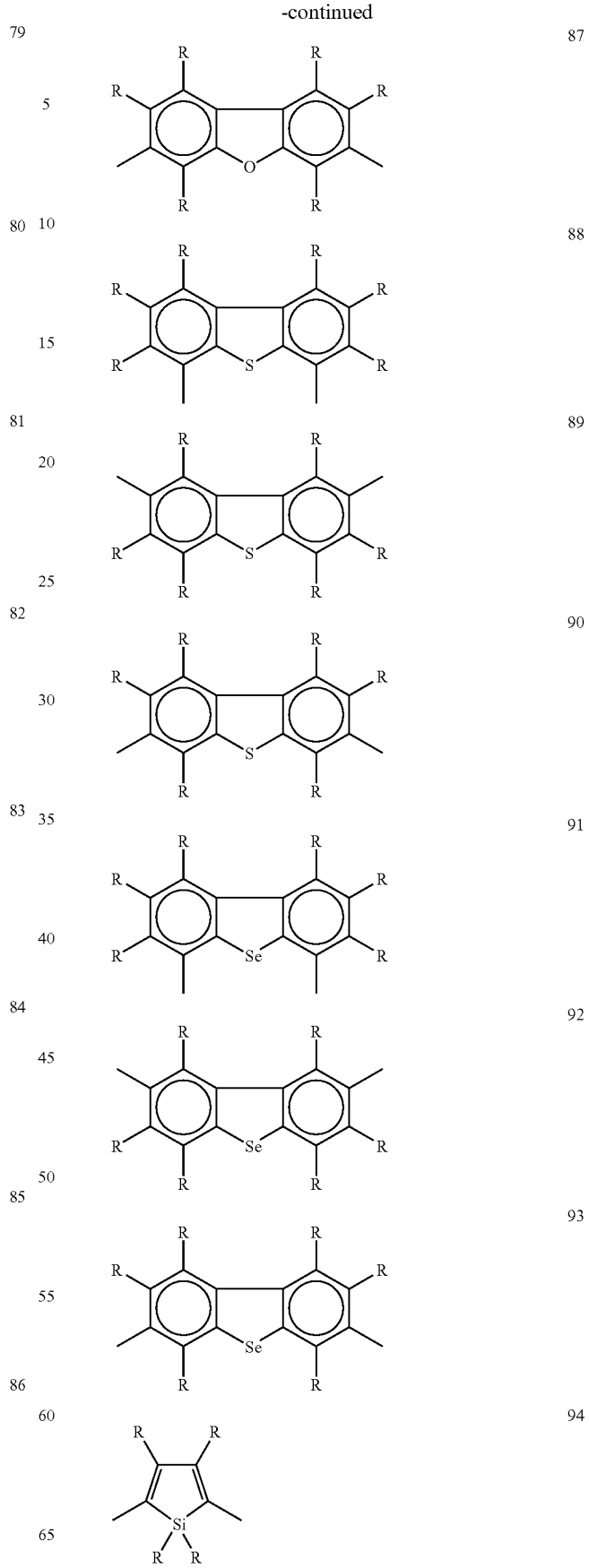

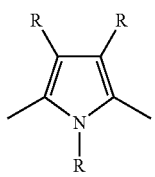
95
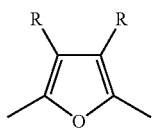
96
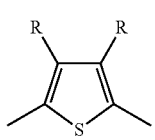
97
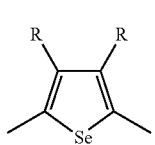
98
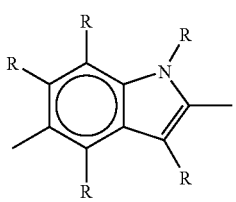
99
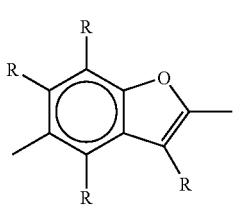
100
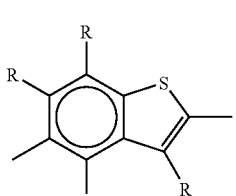
101
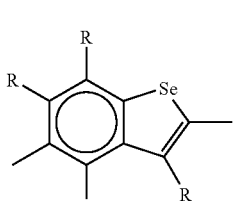
102
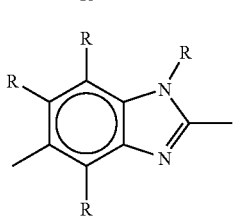
103
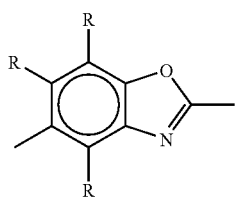
104
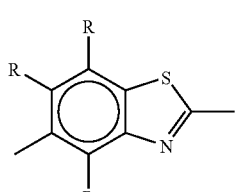
105
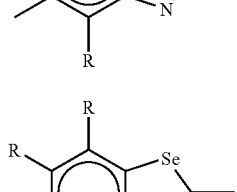
106
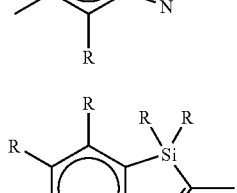
107
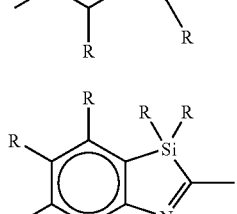
108
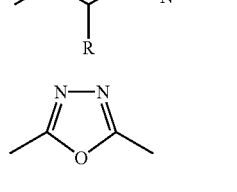
109
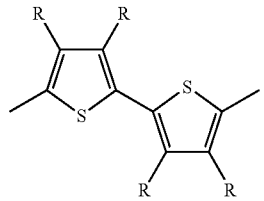
110
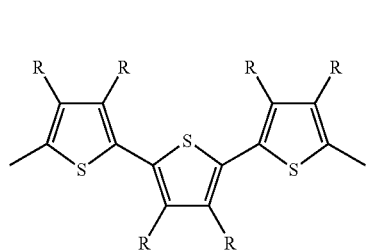
111

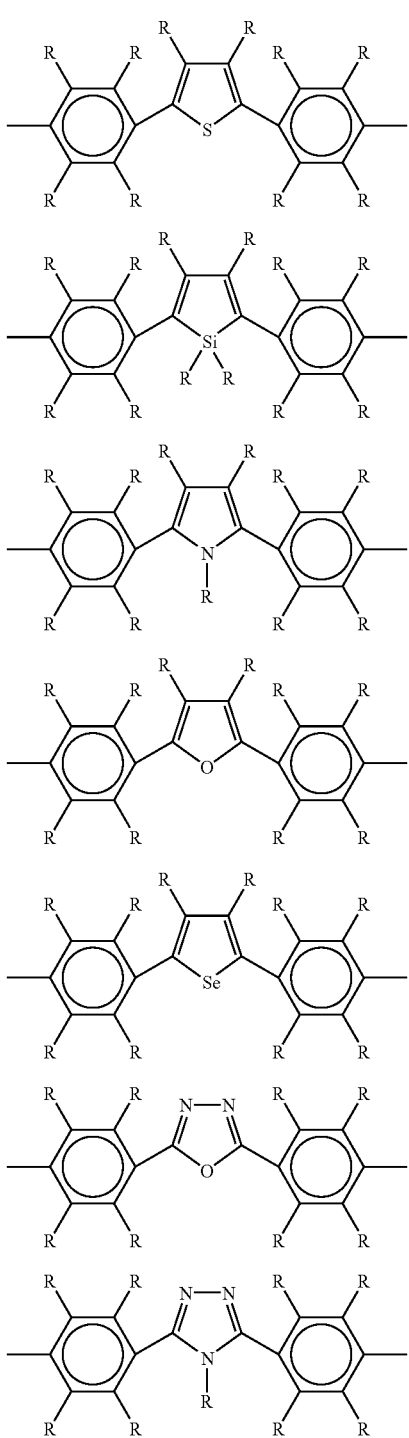

Here, R means a group as the same with those described above.

In the above formula (1), n is 0 or 1. $R_1$ and $R_2$ in formula (1) represent each independently a group selected from a hydrogen atom, an alkyl group, an aryl group, a monovalent heterocyclic compound group, and a cyano group.

In the case where $R_1$ and $R_2$ are substituents other than a hydrogen atom or a cyano group, the alkyl group may be linear, branching or cyclic, and has usually about one to 20 carbon atoms. Examples thereof include specifically methyl group, ethyl group, propyl group, butyl group, pentyl group, hexyl group, heptyl group, octyl group, nonyl group, decyl group, lauryl group, etc. Among them, methyl group, ethyl group, pentyl group, hexyl group, heptyl group, and an octyl group are preferable.

The aryl group has usually about 6 to 60 carbon atoms. Examples thereof include specifically phenyl group, $C_{1-12}$ alkoxyphenyl group, $C_{1-12}$alkylphenyl group, 1-naphtyl group, 2-naphtyl group, etc. Among them, phenyl group and $C_{1-12}$ alkylphenyl group are preferable.

The monovalent heterocyclic compound group has usually about 4 to 60 carbon atoms. Examples thereof include specifically thienyl group, $C_{1-12}$ alkylthienyl group, pyroryl group, furyl group, pyridyl group, $C_{1-12}$ alkylpyridyl group, etc. Among them, thienyl group, $C_{1-12}$ alkylthienyl group, pyridyl group, and $C_{1-12}$ alkylpyridyl group are preferable.

In view of light emitting efficiency, it is suitable that one or more of the repeating units represented by the formula (2) below are contained as a repeating unit other than that represented by the above formula (1).

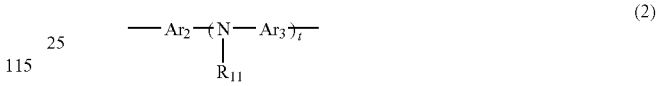

In the formula, $Ar_2$ and $Ar_3$ each independently represent an arylene group, or a divalent heterocyclic compound group. $Ar_2$ does not cross-link to $Ar_3$ $R_{11}$ represents an alkyl group, an aryl group, a mono-valent heterocyclic comound group, a group represented by the below formula (3) or (4). The symbol t is an integer from 1 to 4.

In the formula, $Ar_4$ is an arylene group or a divalent heterocyclic compound group. $R_1$ represents a hydrogen atom, an alkyl group, an aryl group, mono-valent heterocyclic group, or a group represented by the below formula (4). $Z_{12}$ represents —$CR_{13}$=$CR_{14}$— or —C≡C—. $R_{13}$ and $R_{14}$ each independently represents a hydrogen atom, an alkyl group, an aryl group, mono-valent heterocyclic group, or cyano group. The symbol u is an integer from 0 to 2.

In the formula, $Ar_5$ and $Ar_6$ each independently represents an arylene group or a divalent heterocyclic compound group. $R_{15}$ represents an alkyl group, an aryl group, or mono-valent heterocyclic group. $R_{16}$ represents a hydrogen atom, an alkyl group, an aryl group, or mono-valent heterocyclic group. The symbol v is an integer from 1 to 4.

Examples of the arylene group and divalent heterocyclic compound group in $Ar_2$ to $Ar_6$ include the same with those exemplified in the above $Ar_1$.

Examples of the alkyl group, aryl group and mono-valent heterocyclic compound group in $R_{11}$ to $R_{16}$ include the same with those exemplified in the above $R_1$ or $R_2$.

Concrete examples of the repeating units represented by the above formula (2) are as follows.
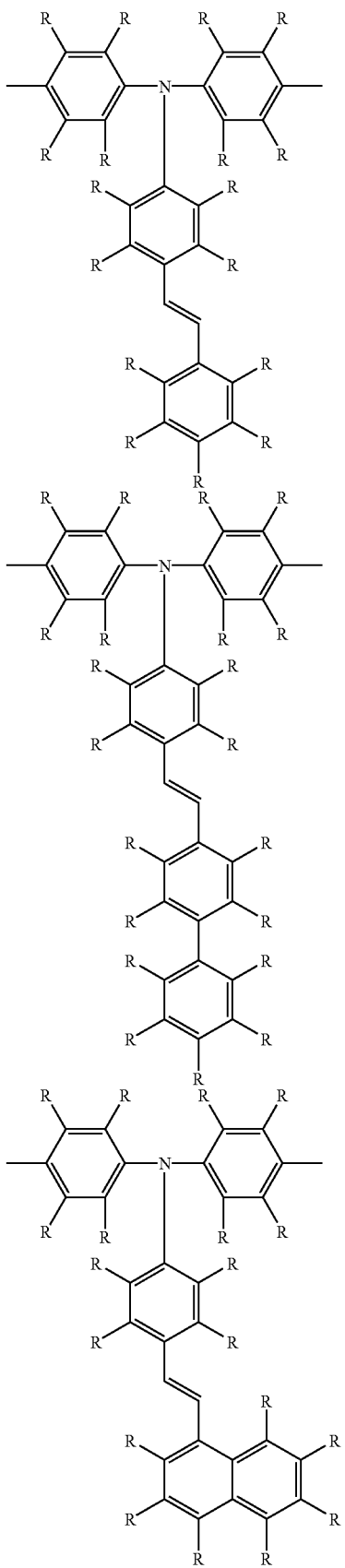
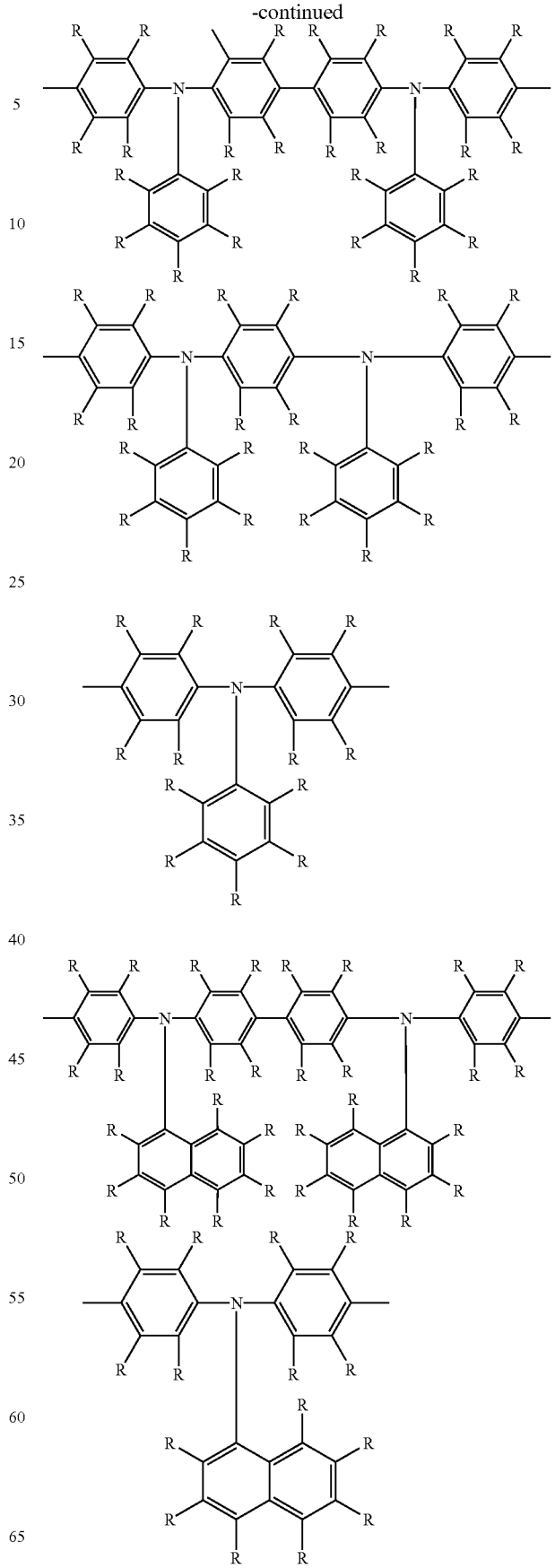

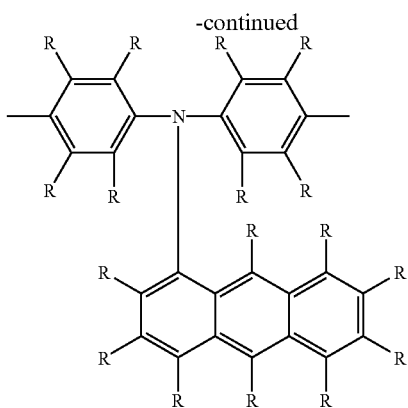

R Is the same as above.

It is also suitable that one or more of the repeating units represented by the below formula (5) are contained as a repeating unit other than that represented by the above formula (1).

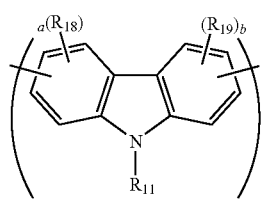

(5)

In the formula, $R_{11}$ means the same as above. $R_{18}$ and $R_{19}$ represent substituents on aromatic ring. Examples thereof include a halogen atom, alkyl group, alkenyl group, aralkyl group, arylthio group, arylalkenyl group, cyclic alkenyl group, alkoxy group, aryloxy group, alkyloxy carbonyl group, aralkyloxy carbonyl group, aryloxy carbonyl group, aryl group, or mono-valent heterocyclic compound group. The symbols a and b each independently represent an integer from 0 to 3. When a or b is 2 or more, $R_{18}$ and $R_{19}$ are the same or different mutually, which may be connected to form a ring.

Examples of the mono-valent heterocyclic compound group, alkoxy group include the same with those exemplified in the above $R_1$ and $R_2$.

Exemplified are: fluorine atom, chlorine atom, bromine atom and iodine atom as the halogen atom; methyl group, ethyl group, n-propyl group, iso-propyl group, n-butyl group, iso-butyl group, t-butyl group, n-amyl group, noepentyl group, n-hexyl group, n-oxtyl group, n-nonyl group, 2,3,4-trimethyl-3-pentyl group, 2,4-dimethyl-3-pentyl group, etc. as the alkyl group; 2-methyl-1-propenyl group and 2-butenyl group, etc. as the alkenyl group; benzyl group, 2-phenylethyl group, 2-naphthylethyl group, diphenylmethyl group, etc. as the aralkyl group; thiophenyl group, etc. as the arylthio group; trans-β-styryl group, 3-phenyl-1-propenyl group, etc. as the arylalkenyl group; 1-cyclohexenyl group, etc. as the cyclic alkenyl group; methoxy group, ethoxy group, n-propoxy group, t-butoxy group, etc. as the alkoxy group; phenoxy group, naphthyloxy group, diphenyloxy group, etc. as the aryloxy group; methoxy carbonyl group, ethoxy carbonyl group, t-butyloxy carbonyl group, etc. as the alkyoxy carbonyl group; benzyloxy carbonyl group, etc. as the aralkyloxy carbonyl group; phenyloxy carbonyl group, etc. as the aryloxy carbonyl group; pheny group, naphtyl group, biphenyl group, furyl group, etc. as the aryl group.

A protecting group may be used to stabilize the terminal group of a polymeric light emitting substance in accordance with the present invention since if an active polymerizable group remains intact, there is a possibility of reduction of the light emitting property and life of the polymeric light emitting substance when the material is used in a device. Groups having a conjugated bond continued to the conjugated structure of the main chain are preferable, and examples thereof include structures containing a bond to an aryl group or a heterocyclic compound group via a vinylene group. Specifically, substituents described in JP-A No. 9-45478, chemical formula 10, and the like are exemplified.

The polymeric light emitting substance of the present invention may also contain repeating units other than the repeating unit of the general formula (1) and the repeating unit having a metal complex structure showing light emission from the triplet excited state, in an amount not deteriorating light emission property and charge transfer property. Further, the repeating unit of the general formula (1), the repeating unit having a complex structure showing light emission from the triplet excited state, and other repeating units may be connected in the form of non-conjugated units, or these non-conjugated parts may be contained in the repeating units. As the bonding structure, there are exemplified the following structures, combinations of the following structures with a vinylene group, combinations of two or more of the following structures, and the like. Here, R is a group selected from the same substituents as described above, and Ar represents a hydrocarbon group having 6 to 60 carbon atoms.

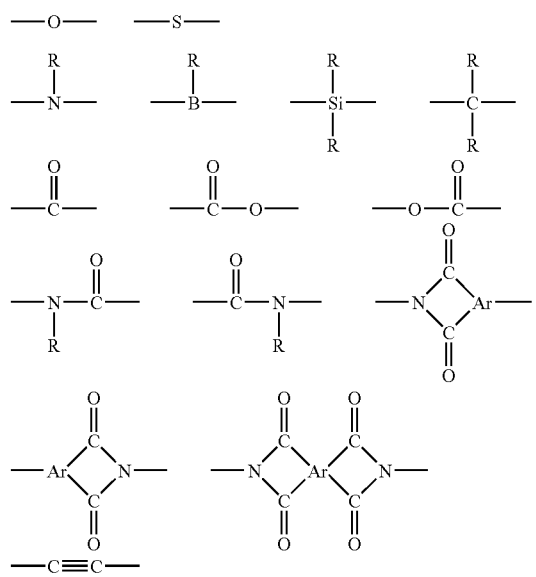

In the polymeric light emitting substance of the present invention, the amount of the repeating units having a metal complex structure showing light emission from the triplet excited state is 0.01 molt or more and 10 molt or less based on the total amount of the repeating units of the general formulas (1), (2) and (5), and the repeating units having a metal complex structure showing light emission from the triplet excited state.

The polymeric light emitting substance of the present invention is characterized by emitting the light from the complex of the below formula (6):

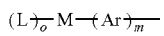 (6)

In the formula, M represents a metal atom having an atomic number of 50 or more and showing a possibility of the inter-system crossing between the singlet state and the triplet state in this complex by a spin-orbital mutual action. Ar represents a ligand bonded to M, via one or more of a nitrogen atom, oxygen atom, carbon atom, sulfur atom and phosphorus atom, with bonding to a polymer at an arbitrary position. L represents a hydrogen atom, hydrocarbon group having 1 to 10 carbon atoms, carboxylate group having 1 to 10 carbon atoms, diketonate group having 1 to 10 carbon atoms, halogen atom, amide group, imide group, alkoxide group, alkylmercapto group, carbonyl ligand, arylene ligand, alkene ligand, alkyne ligand, amine ligand, imine ligand, nitrile ligand, isonitrile ligand, phosphine ligand, phosphine oxide ligand, phosphite ligand, ether ligand, sulfone ligand, sulfoxide ligand or sulfide ligand, m represents an integer of 1 to 5. o represents an integer of 0 to 5.

As the halogen atom represented by X, iodine, bromine, chlorine and the like are exemplified. As the arylsulfonyloxy group, a pentafluorophenylsulfonyloxy group, p-toluenesulfonyloxy group and the like are exemplified, and as the alkylsulfonyloxy group, a methanesulfonyloxy group, trifluoromethanesulfonyloxy group and the like are exemplified.

Of them, M is preferably rhenium atom, osmium atom, iridium atom, platinum atom, samarium atom, europium atom, gold atom, gadolinium atom, terbium atom or dysprosium atom, more preferably iridium atom, platinum atom, or gold atom, and further preferably iridium atom.

Ars are the same or different mutually and represent a ligand bonded to M, via one or more of a nitrogen atom, oxygen atom, carbon atom, sulfur atom and phosphorus atom, with bonding to a polymer at an arbitrary position.

Of them, it is preferable that Ar is a tetra-dentate ligand bonded to M, via any four atoms of a nitrogen atom, oxygen atom, carbon atom, sulfur atom and phosphorus atom. For example, as a ligand in which four pyrrole rings are connected in the form of ring, 7,8,12,13,17,18-hexakisethyl-21H,23H-porphyrin is specifically listed.

Further, it is also that Ar is a bidentate ligand forming a 5-membered ring by bonding to M, via any two atoms of a nitrogen atom, oxygen atom, carbon atom, sulfur atom and phosphorus atom.

It is more preferable that M bonds to at least one carbon atom and Ar is bidentate ligand represented by the below formula

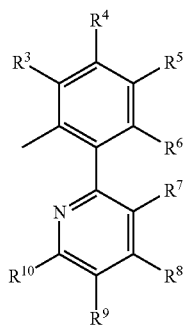 (7)

In the formula, $R^3$ to $R^{10}$ represent halogen atom, alkyl group, alkenyl group, aralkyl group, arylthio group, arylalkenyl group, cyclic alkenyl group, alkoxy group, aryloxy group, alkyloxy carbonyl group, aralkyloxy carbonyl group, aryloxy carbonyl group, or aryl group. At least one of $R^3$ to $R^{10}$ is a bonding group to a polymer chain.

As Ar, exemplified are ligands constituted by connecting heterocyclic rings such as a pyridine ring, thiophene ring, benzooxazole ring and the like, and a benzene ring, and specific examples thereof include phenylpyridine, 2-(p-phenylphenyl)pyridine, 7-bromobenzo[h]quinoline, 2-(4-thiophen-2-yl)pyridine, 2-(4-phenylthiophen-2-yl)pyridine, 2-phenylbenzooxazole, 2-(p-phenylphenyl)benzooxazole, 2-phenylbenzothiazole, 2-(p-phenyphenyl)benzothiazole, 2-(benzohiophen-2-yl)pyridine and the like, which may have one or more substituents.

As the substituents of Ar, exemplified are a halogen atom, alkyl group, alkenyl group, aralkyl group, arylthio group, arylalkenyl group, cyclic alkenyl group, alkoxy group, aryloxy group, alkyloxy carbonyl group, aralkyloxy carbonyl group, aryloxy carbonyl group, aryl group, or mono-valent heterocyclic compound group. Concrete examples are the same as those represented in $R_{18}$ and $R_{19}$.

Examples of L in the general formula (6) include: methyl group, ethyl group, propyl group, butyl group, cyclohexyl group as the alkyl group; phenyl group, tolyl group, 1-naphtyl group, 2-naphtyl group, etc. as the aryl group; and phenylpyridine, 2-(p-phenylphenyl)pyridine, 7-bromobenzo[h]quinoline, 2-(4-thiophen-2-yl)pyridine, 2-(4-phenylthiophen-2-yl) pyridine, 2-phenylbenzooxazole, 2-(p-phenylphenyl) benzooxazole, 2-phenylbenzothiazole, 2-(p-phenyphenyl) benzothiazole, 2-(benzohiophen-2-yl)pyridine, etc. as the heterocyclic compound group.

The carboxylate group having 1 to 10 carbon atoms is not particularly restricted, and examples thereof include an acetate group, naphthenate group, 2-ethylhexanoate group and the like. As the diketonate group having 1 to 10 carbon atoms is not particularly restricted, and examples thereof include an acetylacetonate group and the like. The halogen atom is not particularly restricted, and examples thereof include a fluorine atom, chlorine atom, bromine atom, iodine atom and the like. The amide group is not particularly restricted, and examples thereof include a dimethylamide group, diethylamide group, diisopropylamide group, dioctylamide group, didecylamide group, didodecylamide group, bis(trimethylsilyl)amide group, diphenylamide group, N-methylanilide, anilide group and the like. The imide group is not particularly restricted, and examples thereof include a benzophenoneimide and the like. The alkoxy group is not particularly restricted, and examples thereof include a methoxide group, ethoxide group, propoxide group, butoxide group, phenoxide group and the like. The alkylmercapto group is not particularly restricted, and examples thereof include a methylmercapto group, ethylmercapto group, propylmercapto group, butylmercapto group, phenylmercapto group and the like. The arene ligand is not particularly restricted, and examples thereof include benzene, toluene, xylene, trimethylbenzene, hexamethylbenzene, naphthalene and the like. The alkene ligand is not particularly restricted, and examples thereof include ethylene, propylene, butene, hexene, decene and the like. The alkyne ligand is not particularly restricted, and examples thereof include acetylene, phenylacetylene, diophenylacetylene and the like. The amine ligand is not particularly restricted, and examples thereof include triethylamine, tributylamine and the like. The imine ligand is not particularly restricted, and examples thereof include a benzophenoneimine, methylethylimine and the like. The nitrile ligand is not particularly restricted, and examples thereof include acetonitrile, benzonitrile and the like. The isonitrile is not particularly restricted, and examples thereof include t-butylisonitrile, phenylisonitrile and the like. The phosphine ligand is not particularly restricted, and examples thereof include triphenylphosphine, tritolylphosphine, tricyclohexylphosphine, tributylphosphine and the like. The phosphine oxide ligand is not particularly restricted, and examples thereof include tributylphosphine oxide, triphenylphosphine oxide and the like. The phosphite ligand is not particularly restricted, and examples thereof include triphenylphosphite, tritolylphosphite, tributylphosphite, triethylphosphite and the like. The ether ligand is not particularly restricted, and examples thereof include dimethyl ether, diethylether, tetrahydrofuran and the like. The sulfone ligand is not particularly restricted, and examples thereof include dimethylsulfone, dibutylsulfone and the like. The sulfoxide ligand is not particularly restricted, and examples thereof include dimethylsulfoxide, dibutylsulfoxide and the like. The sulfide ligand is not particularly restricted, and examples thereof include ethyl sulfide, butyl sulfide and the like.

The above-mentioned polymeric light emitting substance may be a random, block or graft copolymer, or a polymer having an intermediate structure of them, for example, a random copolymer having a property of block. From the standpoint of obtaining a polymeric light emitting substance having high quantum yield of light emission, a random copolymer having a property of block, and a block or graft copolymer is preferable, rather than a complete random copolymer.

As this polymeric light emitting substance, those showing light emission in solid state are suitably used, due to utilization of light emission from a thin film.

As the good solvent for the above-mentioned polymeric light emitting substance, chloroform, methylene chloride, dichloroethane, tetrahydrofuran, toluene, xylene, mesitylene, tetralin, decalin, n-butylbenzene and the like are exemplified. Depending on the structure and molecular weight of a polymeric light emitting substance, the polymeric light emitting substance can be usually dissolved in these solvents in an amount of 0.1% by weight or more.

The polymeric light emitting substance of the present invention has a polystyrene reduced number-average molecular weight of from $10^3$ to $10^8$. The total number of the repeating structures varies also depending on the repeating structure and ratio thereof. From the standpoint of film formation property, it is generally that the total number of repeating units is preferably from 20 to 10000, further preferably from 30 to 10000, particularly preferably from 50 to 5000.

When the polymeric light emitting substance of the present invention is used as a light emitting material of a polymer LED, it is preferable to conduct polymerization after purification of a monomer before polymerization, by methods such as distillation, sublimation purification, re-crystallization and the like, since the purity thereof exert an influence on light emitting property, and it is preferable to effect purification treatment such as re-precipitation purification, chromatography fractionation and the like, after synthesis.

The polymeric light emitting substance of the present invention can be produced by polymerization using as a raw material a monomer having a polymerization active group derived from the complex emitting triplet luminescence. When there is a possibility of decomposition of a monomer having a polymerization active group derived from the complex emitting triplet luminescence, under polymerization conditions, it may also be permissible that polymerization is conducted using as a raw material a monomer having a polymerization active group derived from the complex emitting triplet luminescence, to obtain a polymer, and this polymer is reacted with a center metal of the complex emitting triplet luminescence.

As the polymerization active group use here, there are listed, for example, a formyl group, phosphonium group, halogen groups such as bromine, iodine, chlorine and the like, vinyl group, halomethyl group, acetonitrile group, alkylsulfonyloxy groups such as a trifluoromethanesulfonyloxy group and the like, arylsulfonyloxy groups such as a toluenesulfonyloxy group and the like, though varying depending on the polymerization method.

The polymeric light emitting substance of the present invention can be produced by polymerization using a monomer having a polymerization active group derived from the complex emitting triplet luminescence and, if necessary, other monomers as raw materials, according to JP-A No. 5-202355, for example.

Namely, exemplified are:

[1] a polymerization of a compound having aldehyde group with a compound having phosphonium salt group according to Wittig reaction;

[2] a polymerization of a compound having aldehyde group and phosphonium salt group according to Wittig reaction;

[3] a polymerization of a compound having vinyl group with a compound having halogen group according to Heck reaction;

[4] a polymerization of a compound having vinyl group and halogen group according to Heck reaction;

[5] a polymerization of a compound having aldehyde group with a compound having alkyl phosphonate group according to Horner-Wadsworth-Emmons method;

[6] a polymerization of a compound having aldehyde group and alkyl phosphonate group according to Horner-Wadsworth-Emmons method;

[7] a polycondensation of a compound having two methyl halide groups according to de-hydrohalogenation method;

[8] a polycondensation of a compound having two sulfonium salt groups according to the sulfonium salt decomposing method;

[9] a polymerization of a compound having aldehyde group with a compound having acetonitrile group according to Knoevenagel reaction;

[10] a polymerization of a compound having aldehyde group and acetonitrile group according to Knoevenagel reaction; and

[11] a polymerization of a compound having two or more aldehyde groups according to the McMurry reaction.

The polymerizations [1] to [11] are shown as follows.

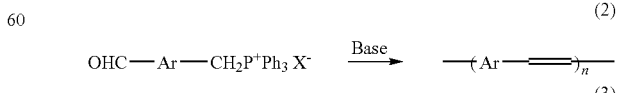

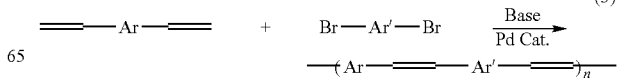

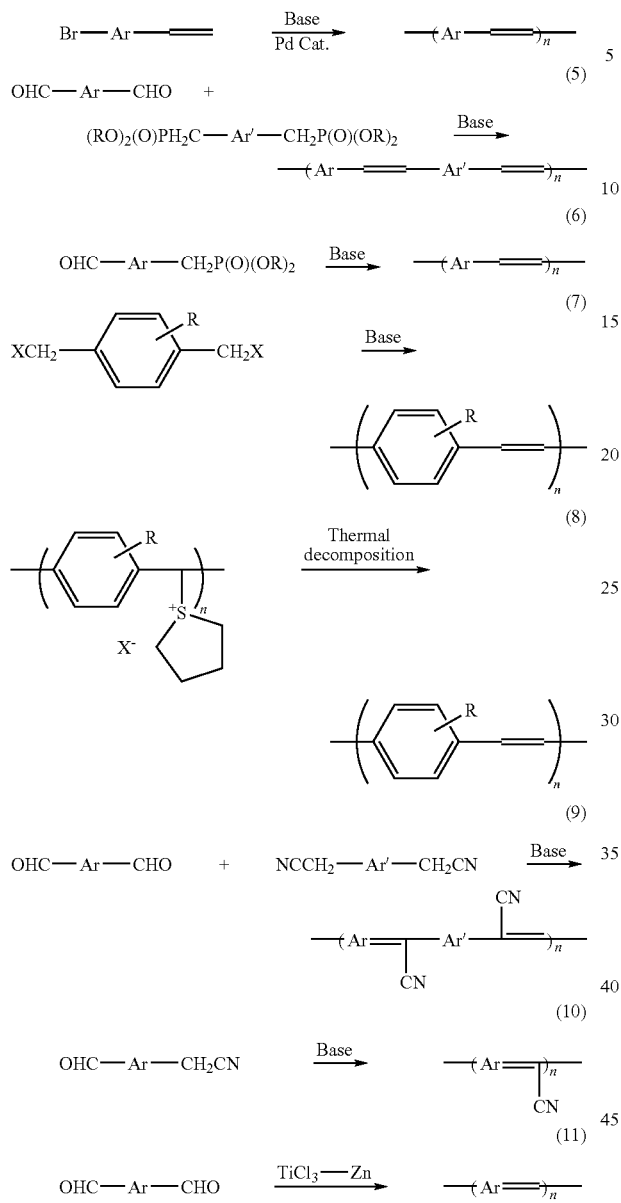

When a vinylene group is not contained in the main chain, there are exemplified methods in which polymerization is effected with using a monomer having a polymerizable group derived from a complex emitting triplet luminescence, and if necessary, using another monomer:

[12] a method of polymerization according to a Suzuki coupling reaction,
[13] a method of polymerization according to a Grignard reaction,
[14] a method of polymerization using a Ni(O) catalyst,
[15] a method of polymerization using an oxidizing agent such as $FeCl_3$ and the like, a method of oxidation polymerization electrochemically,
[16] a method according to decomposition of an intermediate polymer having a suitable releasing group, and the like.

The polymerization methods [12] to [16] are shown as follows.

Among the above, methods of effecting polymerization according to Wittig reaction, Heck reaction, Horner-Wadsworth-Emmons method, Knoevenagel reaction, Suzuki coupling reaction, Grignard reaction, and a polymerization using a Ni(O) catalyst are suitable since reaction control is easy. In view of the availability of the raw materials and simple operationality of the polymerization reaction, polymerizations according to Suzuki coupling reaction or Grignard reaction, and a polymerization using a Ni(O) catalyst are preferable.

Monomers can be reacted with dissolving in a solvent if necessary, with using an appropriate catalyst such as, for example, an alkali, and at a temperature of above the melting point and below the boiling point of the organic solvent. Known methods can be used as described in: Organic Reactions, volume 14, pages 270-490, (John Wiley & Sons, Inc., 1965); Organic Reactions, volume 27, pages 345-390 (John Wiley & Sons, Inc., 1982); Organic Synthesis, Collective Volume VI, pages 407-411 (John Wiley & Sons, Inc., 1988); Chemical Review, volume 95, page 2457 (1995); J. Organomet. Chem., volume 576, page 147 (1999); J. Prakt. Chem., volume 336, page 247 (1994); and Makromol. Chem. Macromol. Symp., volume 12, page 229 (1987).

Though the organic solvent varies also depending on compounds and reactions used, it is generally preferable that de-oxygen treatment is sufficiently performed on the solvent used and the reaction thereof is allowed to progress under an inert atmosphere, to suppress a side reaction. Further, it is preferable to conduct dehydration treatment likewise (however, this is not applicable in the case of a reaction in a two-phase system with water, such as a Suzuki coupling reaction.).

An alkali and a suitable catalyst are added appropriately for progressing a reaction. These may advantageously be selected depending on the reaction used. It is preferable that this alkali or catalyst is sufficiently dissolved in a solvent used for the reaction. As the method of mixing an alkali or catalyst, there is exemplified a method in which a solution of an alkali or catalyst is added slowly while stirring the reaction solution under an inert atmosphere such as argon, nitrogen and the like, or the reaction solution is added slowly to the solution of an alkali or catalyst, conversely.

In the method of producing a polymeric light emitting substance of the present invention, monomers may be mixed and reacted at one time, or mixed divisionally, if necessary.

Regarding more specific reaction conditions in the case of a Wittig reaction, Horner reaction, Knoevengel reaction and the like, an alkali is used in an equivalent amount or more, preferably from 1 to 3 equivalent based on the functional group of a monomer, and reacted. The alkali is not particularly restricted, and there can be used, for example, potassium-t-butoxide, sodium-t-butoxide, metal alcolates such as sodium ethylate, lithium methylate and the like, hydride reagents such as sodium hydride and the like, amide such as sodiumamide and the like. As the solvent, N,N-dimethylformadide, tetrahydrofuran, dioxane, toluene and the like are used. The temperature for the reaction is usually from room temperature to about 150° C. The reaction time is, for example, from 5 minutes to 40 hours, and time for sufficient progress of polymerization may be permissible, and there is no necessity of leaving for along period of rime after completion of the reaction, therefore, the reaction time is from 10 minutes to 24 hours. The concentration in the reaction may be appropriately selected in the range from about 0.01 wt % to the maximum solution concentration, since reaction efficiency is poor when too thin and reaction control is difficult when too thick, and usually is in the range from 0.1 wt % to 20 wt %. In the case of a Heck reaction, monomers are reacted in the presence of a base such as triethylamine and the like, using a palladium catalyst. A solvent having a relatively high boiling point such as N,N-dimethylformamide, N-methylpyrrolidone and the like is used, the reaction temperature is from about 80 to 160%, and the reaction time is from about 1 hour to 100 hours.

In the case of a Suzuki coupling reaction, palladium[tetrakis(triphenylphosphine)], palladium acetates and the like, for example, are used, and an inorganic base such as potassium carbonate, sodium carbonate, barium hydroxide and the like, an organic base such as triethylamine and the like, and an inorganic salt such as cesium fluoride and the like are added in an amount of equivalent or more, preferably from 1 to 10 equivalent based on monomers, and reacted. An inorganic salt may be reacted in the form of an aqueous solution, in a two-phase system. As the solvent, N,N-dimethylformamide, toluene, dimethoxyethane, tetrahydrofuran and the like are exemplified. Though depending on the solvent, a temperature of from about 50 to 160° C. is preferably used. It may also be permissible to heat the reaction solution to a temperature near the boiling point of the solvent, to cause reflux. The reaction time is from about 1 hour to 200 hours.

In the case of a Grignard reaction, a method is exemplified in which a halogenated compound and metal Mg are reacted in an ether-based solvent such as tetrahydrofuran, diethyl ether, dimethoxyethane and the like to prepare a Grignard reagent solution which is mixed with a monomer solution prepared separately, and a nickel or palladium catalyst is added while paying attention to excess reaction to the resulted mixture which is then heated to cause a reaction under reflux. A Grignard reagent is used in equivalent or more, preferably from 1 to 1.5 equivalent, more preferably from 1 to 1.2 equivalent based on monomers. Also in the case of polymerization by methods other than this, the reaction can be conducted according to known methods.

The method of producing a polymeric light emitting substance of the present invention is a production method, comprising reacting a monomer of $X_1$—A—$X_2$ (wherein, $X_1$ and $X_2$ each independently represent a halogen atom, alkylsulfonyloxy group or arylsulfonyloxy group. —A— represents a repeating unit having a metal complex structure showing light emission from the triplet excited state.) with $X_3$—$Ar_1$—$X_4$ (wherein, $X_3$ and $X_4$ each independently represent a halogen atom, alkylsulfonyloxy group or arylsulfonyloxy group.) in the presence of a Ni catalyst.

Another method of producing a polymeric light emitting substance of the present invention is a production method, comprising reacting a monomer of $Y_1$—A—$Y_2$ (wherein, $Y_1$ and $Y_2$ each independently represent a boric acid group or borate group.) with a monomer of $Z_1$—Ar—$Z_2$ (wherein, $Z_1$ and $Z_2$ represent a halogen atom, alkylsulfonyloxy group or arylsulfonyloxy group.) in the presence of a Pd catalyst.

Still another method of producing a polymeric light emitting substance of the present invention is a production method, comprising reacting a monomer of $Y_3$—$Ar_1$—$Y_4$ (wherein, $Y_3$ and $Y_4$ each independently represent a boric acid group or borate group.) with a monomer of $Z_3$—A—$Z_4$ (wherein, $Z_3$ and $Z_4$ each independently represent a halogen atom, alkylsulfonyloxy group or arylsulfonyloxy group.) in the presence of a Pd catalyst.

Particularly, the amount of a monomer of $X_1$—A—$X_2$, a monomer of $Y_1$—A—$Y_2$, or a monomer of $Z_3$—A—$Z_4$, is from 0.01 molt or more and 10 mol % or less based on the total amount of monomers.

By method of producing a polymeric light emitting substance of the present invention, a polymeric light emitting substance having in the main chain or side chain of the polymer a metal complex structure showing light emission from the triplet excited state can be easily synthesized, leading to a significant industrial advantage.

In the above-mentioned polymers, —A— represents a repeating unit having a metal complex structure showing light emission from the triplet excited state, and specifically, there are listed divalent groups in which any two of Rs in above-exemplified complex emitting triplet luminescence are bonding sites with the adjacent repeating unit.

As the halogen atom represented by $X_1$, $X_2$, $X_3$, $X_4$, $Z_1$, $Z_2$, $Z_3$ and $Z_4$, iodine, bromine, chlorine and the like are exemplified. As the arylsulfonyloxy group, a pentafluorophenylsulfonyloxy group, p-toluenesulfonyloxy group and the like are exemplified, and as the alkylsulfonyloxy group, a methanesulfonyloxy group, trifluoromethanesulfonyloxy group and the like are exemplified.

As the boric acid group and borate group represented by $Y_1$, $Y_2$, $Y_3$ and $Y_4$, a boric acid group, dimethyl borate, ethylene borate, trimethylene borate and the like are exemplified.

As the example of reaction in the presence of a Ni catalyst, a method of polymerization using the above-mentioned Ni(O) catalyst is exemplified.

As the nickel catalyst, an ethylenebis(triphenylphosphine) nickel complex, tetrakis(triphenylphosphine)nickel complex, bis(cyclooctadienyl)nickel complex, and the like, are exemplified.

As the example of reaction in the presence of a Pd catalyst, the above-mentioned Suzuki coupling reaction is exemplified.

As the palladium catalyst, palladium acetate, palladium [tetrakis(triphenylphosphine)] complex, bis(tricyclohexylphosphine)palladium complex, and the like, are exemplified.

The complex of the present invention will be described below.

The complex of the present invention has a ligand carrying a bromine atom, chlorine atom, iodine atom, arylsulfonyloxy group, alkylsulfonyloxy group and the like as a reactive functional group, and is a novel complex having iridium, platinum, europium or gold as a center metal, and a complex which can be a monomer, a raw material of the polymeric light emitting substance of the present invention. This complex solves a problem that the above-mentioned known complex has no reactive functional group, and it is difficult to convert the complex into a derivative or to use the complex as a monomer for polymer synthesis.

The complex of the present invention is a complex of the general formula (8):

(8)

In the formula, L, M, Ar, m and o are the same as those described above. X represents a halogen atom, arylsulfonyloxy group or alkylsulfonyloxy group.

As the halogen atom represented by X, iodine, bromine, chlorine and the like are exemplified. As the arylsulfonyloxy group, a pentafluorophenylsulfonyloxy group, p-toluenesulfonyloxy group and the like are exemplified, and as the alkylsulfonyloxy group, a methanesulfonyloxy group, trifluoromethanesulfonyloxy group and the like are exemplified.

Of them, preferable is the complex wherein when energies of the singlet state and the triplet state of the complex of the formula (8) in which all Xs represent a hydrogen atom are calculated by a B3LYP method, the different between the energies of the singlet state and the triplet state is 6 eV or less. This difference is preferably 4 eV or less, further preferably 2 eV or less.

Particularly, complexes of the general formula (9) is preferable.

(9)

In the formula, M' represents an iridium atom, platinum atom or gold atom. Ar's are the same or different and represent a bidentate ligand forming a 5-membered ring by bonding to M', via a nitrogen atom and carbon atom, the bidentate ligand containing at least one bromine atom. L's each independently represent a hydrogen atom, alkyl group, aryl group, heterocyclic compound group, hydrocarbon group having 1 to 10 carbon atoms, carboxylate group having 1 to 10 carbon atoms, diketonate group having 1 to 10 carbon atoms, halogen atom, amide group, imide group, alkoxide group, alkylmercapto group, carbonyl ligand, arylene ligand, alkene ligand, alkyne ligand, amine ligand, imine ligand, nitrile ligand, isonitrile ligand, phosphine ligand, phosphine oxide ligand, phosphite ligand, ether ligand, sulfone ligand, sulfoxide ligand or sulfide ligand. q represents an integer of 1 to 3. r represents an integer of 0 to 2.

Specific examples of the ligand Ar' of the complex of the general formula (9) include, when represented in the form (Ar'H) in which a hydrogen atom is added to a carbon atom bonded to M, 2-m-bromophenylpyridine, 2-(m-bromo-p-phenylphenyl)pyridine, 7-bromobenzo[h]quinoline, 2-(5-bromo-4-thiophen-2-yl)pyridine, 2-(5-bromo-4-phenylthiophen-2-yl)pyridine, 2-m-bromophenylbenzooxazole, 2-(m-bromo-p-phenylphenyl)benzooxazole, 2-m-bromophenylbenzothiazole, 2-(m-bromo-p-phenylphenyl)benzothiazole, 2-(6-bromobenzothiophen-2-yl)pyridine, 2-bromo-7,8,12,13,17,18-hexakisethyl-21H,23H-porphyrin, 6-bromo-1,10-phenanethroline, benzoyl-p-bromobenzoylmethane, (4-bromothenoyl)trifluoroacetone and the like, and preferable are 2-m-bromophenylpyridine, 7-bromobenzo[h]quinoline, 2-m-bromophenylbenzooxazole, 2-m-bromophenylbenzothiazole and the like.

The ligand Ar' of the complex of the general formula (9) may have a substituent such as a halogen atom, alkyl group, alkenyl group, aralkyl group, arylthio group, arylalkenyl group, cyclic alkenyl group, alkoxy group, aryloxy group, alkyloxycarbonyl group, aralkyloxycarbonyl group, aryl group and the like.

Specific examples of the substituent represented by Ar' are as follows.

As the halogen atom, a fluorine atom, chlorine atom, bromine atom, iodine atom and the like are listed, as the alkyl group, a methyl, ethyl group, n-propyl group, isopropyl group, n-butyl group, isobutyl group, t-butyl group, n-amyl group, neopentyl group, n-hexyl group, cyclohexyl group, n-octyl group, n-nonyl group, 2,3,4-trimethyl-3-pentyl group, 2,4-dimethyl-3-pentyl group and the like are listed, as the alkenyl group, a 2-methyl-1-propenyl group, 2-butenyl group and the like are listed, as the aralkyl group, a benzyl group, 2-phenylethyl group, 2-naphtylethyl group, diphenylmethyl group and the like are listed, as the arylthio group, a thiophenyl group and the like are listed, as the arylalkenyl group, a trans B styryl group, 3-phenyl-1-propenyl group and the like are listed, as the cyclic alkenyl group, a 1-cyclohecenyl group and the like are listed, as the alkoxy group, a methoxy group, ethoxy group, n-propoxy group, t-butoxy group and the like are listed, as the aryloxy group, a phenoxy group, naphthyloxy group, diphenyloxy group and the like are listed, as the alkyloxycarbonyl group, a methoxycarbonyl group, ethoxycarbonyl group, t-butyloxycarbonyl group, as the aralkyloxycarbonyl group, a benzyloxycarbonyl group and the like are listed, as the aryloxycarbonyl group, a phenyloxycarbonyl and the like are listed, and as the aryl group, a phenyl group, naphthyl group, biphenyl group, furyl group and the like are listed, respectively.

The above-mentioned substituents other than halogen atoms may be substituted with, for example, halogen atoms such as a fluorine atom, chlorine atom, bromine atom, iodine atom and the like; alkoxy groups such as a methoxy group, ethoxy group, n-propoxy group, t-butoxy group and the like; aryloxy groups such as a phenoxy group and the like; lower alkyl groups such as a methyl group, ethyl group, n-propyl group, isopropyl group, n-butyl group, isobutyl group, t-butyl group, n-amyl group, neopentyl group, n-hexyl group and the like; lower alkylthio groups such as a n-propylthio group, t-butylthio group and the like; arylthio groups such as a phenylthio group, and a nitro group, hydroxyl group and the like.

The hydrocarbon group having 1 to 10 carbon atoms represented by L in the general formula (8) and L' in the general formula (9) is not particularly restricted, and examples thereof include a methyl group, ethyl group, propyl group, butyl group, cyclohexyl group, benzyl group, phenyl group and the like. The carboxylate group having 1 to 10 carbon atoms is not particularly restricted, and examples thereof include an acetate group, naphthenate group, 2-ethylhexanoate group and the like. As the diketonate group having 1 to 10 carbon atoms is not particularly restricted, and examples thereof include an acetylacetonate group and the like. The halogen atom is not particularly restricted, and examples thereof include a fluorine atom, chlorine atom, bromine atom, iodine atom and the like. The amide group is not particularly restricted, and examples thereof include a dimethylamide group, diethylamide group, diisopropylamide group, dioctylamide group, didecylamide group, didodecylamide group, bis(trimethylsilyl)amide group, diphenylamide group, N-methylanilide, anilide group and the like. The imide group is not particularly restricted, and examples thereof include a benzophenoneimide and the like. The alkoxy group is not particularly restricted, and examples thereof include a methoxide group, ethoxide group, propoxide group, butoxide group, phenoxide group and the like. The alkylmercapto group is not particularly restricted, and examples thereof include a methylmercapto group, ethylmercapto group, propylmercapto group, butylmercapto group, phenylmercapto group and the like. The arylene group is not particularly restricted, and examples thereof include benzene, toluene, xylene, trimethylbenzene, hexamethylbenzene, naphthalene and the like. The alkene ligand is not particularly restricted, and examples thereof include ethylene, propylene, butene, hexene, decene and the like. The alkyne ligand is not particularly restricted, and examples thereof include acetylene, phenylacetylene, diophenylacetylene and the like. The amine ligand is not particularly restricted, and examples thereof include triethylamine, tributylamine and the like. The imine ligand is not particularly restricted, and examples thereof include a benzophenoneimine, methylethylimine and the like. The nitrile ligand is not particularly restricted, and examples thereof include acetonitrile, benzonitrile and the like. The isonitrile is not particularly restricted, and examples thereof include t-butylisonitrile, phenylisonitrile and the like. The phosphine ligand is not particularly restricted, and examples thereof include triphenylphosphine, tritolylphosphine, tricyclohexylphosphine, tributylphosphine and the like. The phosphine oxide ligand is not particularly restricted, and examples thereof include tributylphosphine oxide, triphenylphosphine oxide and the like. The phosphate ligand is not particularly restricted, and examples thereof include triphenylphosphite, tritolylphosphite, tributylphosphite, triethylphosphite and the like. The ether ligand is not particularly restricted, and examples thereof include dimethyl ether, diethylether, tetrahydrofuran and the like. The sulfone ligand is not particularly restricted, and examples thereof include dimethylsulfone, dibutylsulfone and the like. The sulfoxide ligand is not particularly restricted, and examples thereof include dimethylsulfoxide, dibutylsulfoxide and the like. The sulfide ligand is not particularly restricted, and examples thereof include ethyl sulfide, butyl sulfide and the like.

Specific examples of the complex (9) of the present invention include, regarding those containing an iridium atom as a center metal M' for example, tris(2-m-bromophenylpyridine)iridium (III), bis(2-m-bromophenylpyridine)(phenylpyridine)iridium (III), (2-m-bromophenylpyridine)di(phenylpyridine)iridium (III), bis(7-bromobenzo[h]quinoline)acetylacetonate iridium (III),bis{2-(5-bromothiophen-2-yl)pyridine}acetylacetonate iridium (III), bis(2-(3-bromophenyl)benzooxazole)acetylacetonate iridium (III), bis(2-(3-bromophenyl)benzothiazole)acetylacetonate iridium (III), bis{2-(5-bromobenzothiophen-2-yl)pyridine}acetylacetonate iridium (III) and the like.

Examples of the complex (3) of the present invention include, regarding those containing a platinum atom as a center metal M', bis(2-m-bromophenylpyridine)platinum(II), (2-m-bromophenylpyridine)(phenylpyridine)platinum (II), (7-bromobenzo[h]quinoline)acetylacetonate platinum(II), {2-(5-bromothiophen-2-yl)pyridine}acetylacetonate platinum (II), (2-(3-bromophenyl)benzooxazole)acetylacetonate platinum (II), (2-(3-bromophenyl)benzothiazole)acetylacetonate platinum (II), {2-(5-bromobenzothiophen-2-yl)pyridine}acetylacetonate platinum (II) and the like.

Examples of the complex (3) of the present invention include, regarding those containing a gold atom as a center metal M', tris(2-m-bromophenylpyridine)(phenylpyridine) gold (III), bis(2-m-bromophenylpyridine)(phenylpyridine) gold (III), (2-m-bromophenylpyridine)di(phenylpyridine) gold (III), bis(7-bromobenzo[h]quinoline)acetylacetonate gold (III), bis{2-(5-bromothiophen-2-yl) pyridine}acetylacetonate gold (III), bis(2-(3-bromophenyl) benzooxazole)acetylacetoante gold (III), bis(2-(3-bromophenyl)benzothiazole)acetylacetonate gold (III), bis{2-(5-bromobenzothiophen-2-yl)pyridine}acetylacetonate gold (III) and the like.

Examples of the complex (3) of the present invention include, regarding those containing an europium atom as a center metal M', (6-bromo-1,10-phenanethroline)tris(dibenzoylmethane)europi um (III), (6-bromo-1,10-phenanathroline)tris[(4-bromothenoyl)trifluo roacetone]europium (III), and the like.

Of them, those in which Ar' is a bidentate ligand of the general formula (10) and r is 0 are preferable, those in which one or more of $R^{21}$ to $R^{28}$ represent a bromine atom are more preferable, those in which $R^{23}$ represents a bromine atom and other groups represent a hydrogen atom are particularly preferable.

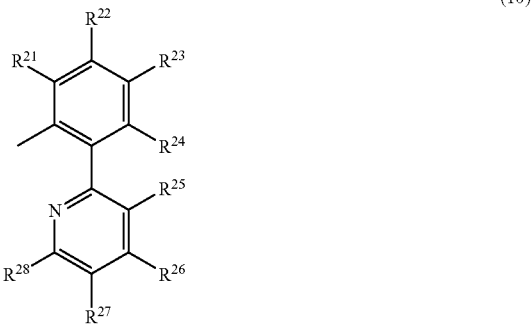

(10)

In the formula, $R^{21}$ to $R^{28}$ each independently represent a hydrogen atom, halogen atom, alkyl group, alkenyl group, aralkyl group, arylthio group, arylalkenyl group, cyclic alkenyl group alkoxy group, aryloxy group, alkyloxycarbonyl group, aralkyloxycarbonyl group, aryloxycarbonyl group, or aryl group. At least one of $R^{21}$ to $R^{28}$ represents a bromine atom.

Specific examples of, R 21 to $R^{28}$ are the same as the concrete examples of the substituent on the ligand Ar' of a complex of the formula (9) describe above.

The method of producing a complex of the present invention will be described using a method of producing a complex of the general formula (9).

The complex of the general formula (9) can be produced by reacting a complex of the general formula (11):

M'-(L')s (11)

(L' has the same meaning as for L' in the formula (9). s represents an integer of 0 to 3) with a compound of the general formula (12):

Ar' H (12)

(Ar' has the same meaning as for Ar' in the formula (9). Ar'H means that a hydrogen atom is added to a carbon atom bonded to M' in Ar'.).

As L', ligands providing a smooth interchange reaction are preferable, such as carboxylate, diketonate group, amide group, imide group, carbonyl ligand, arylene ligand, alkene ligand, alkyne ligand, imine ligand, nitrile ligand, ether ligand, sulfone ligand, sulfoxide ligand, sulfide ligand and the like, since they are bonded to a center metal relatively weakly.

As the above-mentioned Ar'H, commercially available reagents may be used, alternatively, Ar'H may be produced by a known method.

In the production method of the present invention, the ratio of the amount of the complex (11) to the amount of the ligand

(12) is about from 1/0.5 to 1/10 (=complex/ligand) by mol, though it varies depending on the intended complex prepared.

The reaction is usually conducted in a solvent. As the solvent, for example, ether-based solvents such as diethyl ether, tetrahydrofuran, tertiary butyl methyl ether, dioxane, and the like; hydrocarbon-based solvents such as hexane, cyclohexane, toluene, xylene and the like; ester-based solvents such as ethyl acetate, methyl propionate and the like, halogen-based solvents such as dichloromethane, chloroform, 1,2-dichloroethane and the like, ketone-based solvents such as acetone, methyl isobutyl ketone, diethyl ketone and the like, and alcohol-based solvents such as ethanol, butanol, ethylene glycol, glycerin and the like, are used. The used amount of the solvent is not particularly restricted, and usually, from 10 to 500-fold by weight based on the total amount of complexes and ligands which are raw materials.

The reaction temperature is not particularly restricted, and usually from about 50 to 350° C. The reaction time is not particularly restricted, and usually from about 30 minutes to 30 hours.

In the synthesis operation, a solvent is poured into a flask, and the atmosphere in the flask was deaerated with an inert gas, for example, a nitrogen gas or argon gas, according to bubbling and the like, while stirring the solvent, then, a complex (11) and a ligand (12) are added. The reaction solution is heated to a temperature at which ligand exchange occurs, while stirring under an inner gas atmosphere, and the mixture is heat-insulated and stirring. The completion of the reaction can be determined by stop of decrease in the raw materials by TLC monitor and high performance liquid chromatography, or disappearance of one of the raw materials.

Removal of the intended substance from the reaction mixture and purification thereof differ depending on the complex, and usually complex purification means are used.

For example, a 1 N aqueous hydrochloric acid solution which is a poor solvent for a complex is added to cause precipitation of the complex, and this is removed by filtration and this solid is dissolved in an organic solvent such as dichloromethane, chloroform and the like. This solution is filtrated to remove insoluble substances, and concentrated again, and subjected to purification by silica gel column chromatography (dichloromethane elution), and intended fraction solutions are collected, and to this is added, for example, a suitable amount of methanol (poor solvent), and the mixture is concentrated to precipitate the intended complex which if filtrated and dried to obtain a complex. The method of producing a complex (9) or (10) is not restricted to the above-mentioned method.

A polymeric light emitting substance can be produced by using the complex of the present invention as a monomer.

Next, the polymer LED of the present invention will be illustrated. The polymer LED of the present invention is a polymer LED comprising at least a light emitting layer between a pair of electrodes composed of an anode and a cathode at least one of which is transparent or semi-transparent wherein the light emitting layer contains a polymeric light emitting substance of the present invention.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

There are listed polymer LEDs having an electron conductive polymer layer disposed between at least either one of the electrodes and a light emitting layer in adjacent with the electrode; and LEDs having a buffer layer having an average thickness of 2 nm or less, disposed between at least either one of the electrodes and a light emitting layer in adjacent with the electrode.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, "/" indicates adjacent lamination of layers. Hereinafter, the same.)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric light emitting substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 μm, preferably from 2 nm to 500 nm, further preferably from 5 nm to 200 nm.

In the polymer LED of the present invention, a light emitting material other than the above-mentioned polymeric light emitting substances may be mixed in a light emitting layer. Further, in the polymer LED according to the instant application, a light emitting layer containing a light emitting material other than the above-mentioned polymeric light emitting substance may be laminated with a light emitting layer containing the above-mentioned polymeric light emitting substance.

As the light emitting material, known materials can be used. In a compound having lower molecular weight, there can be used, for example, naphthalene derivatives, anthracene or derivatives thereof, perylene or derivatives thereof dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials. used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. When film-forming is conducted from a solution or melted state, a polymer binder may be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylenevinylene) or derivatives thereof, polycarbonate, polyacrylate, poly(methyl acrylate), poly(methyl methacrylate),polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 µm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 µm, preferably from 20 nm to 1 µm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The film thickness of a cathode can be appropriately selected in view of electric conductivity and durability, and for example, it is from 10 nm to 10 µm, preferably from 20 nm to 1 µm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric light emitting substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

Examples will be shown below to explain the present invention further in detail, but these examples do not limit the scope of the invention.

Here, the number-average molecular weight was measured in polystyrene-reduced number-average molecular weight by a gel permeation chromatography (GPC) using chloroform as a solvent.

Example 1

<Production of 2-(bromophenyl)pyridine>

3 g (19.3 mmol) of 2-phenylpyridine and 40 mg (0.716 mmol) of an iron powder were mixed and stirred. 4.0 g (25 mmol) of bromine was dropped paying attention to heat generation while stirring and cooling the mixture to 0° C., and the mixture was heated up to 90° C. and stirred for 10 hours. After completion of the reaction, this reaction mixture was dissolved in chloroform, and washed with a 5% aqueous sodium thiosulfate solution. The chloroform solution was dried over sodium sulfate, then, concentrated, and the residue was purified by silica gel column chromatography, to obtain the intended 2-(bromophenyl)pyridine.

The yield amount was 1.6 g (6.83 mmol) and the yield was 35.4%. M+ was measured to be 234.0 by LC-MS.

<Production of tris(2-bromophenyl)pyridine)iridum (III)>

50 mg (0.1021 mmol) of a trisacetylacetonateiridium (III) complex and 95.6 mg (0.4084 mmol) of 2-bromophenylpyridine and 20 ml of glycol were poured into a 50 ml flask in the form of eggplant and refluxed for 10 hours. To this reaction solution was added 100 ml of a 1 N hydrochloric acid aqueous solution, and the mixture was stirred for 30 minutes, The precipitated solid was removed by filtration, and dissolved again in a small amount of methylene chloride, to give a solution. This solution was filtrated by silica gel column chromatography, to remove excess metal decomposed substances derived from the iridium complex. Thereafter, the resulted solution was concentrated to the intermediate extent, and methanol was added to this and the precipitated yellow solid was recovered by filtration.

10.12 mg (0.0113 mmol) of the intended substance, tris(2-(bromophenyl)pyridine)iridium(III) was obtained. The yield was 11.1%. M+ was measured to be 893 by FD-MS.

Example 2

<Production of bis(2-(phenyl)pyridine)mono(2-(bromophenyl)pyridine)iridium (III)>

0.642 g (1.31 mmol) of a trisacetylacetonateiridium (III) complex, 0.41 g (1.75 mmol) of 2-(bromophenyl)pyridine, 0.54 g (3.5 mmol) of 2-(phenyl)pyridine and 50 ml of glycol were poured into a 100 ml flask in the form of eggplant and refluxed for 10 hours. To this reaction solution was added 100 ml of a 1 N hydrochloric acid aqueous solution, and the mixture was stirred for 30 minutes, The precipitated solid was removed by filtration, and dissolved again in a small amount of methylene chloride, to give a solution. This solution was filtrated by silica gel column chromatography, to remove excess metal decomposed substances derived from the iridium complex. Thereafter, the resulted solution was concentrated to the intermediate extent, and methanol was added to this and the precipitated yellow solid was recovered by filtration. 0.13 g (0.177 mmol) of a mixture consisting of bis(2-(phenyl)pyridine)mono(2-(bromophenyl)pyridine)iridum (III) as the main component was obtained. The yield was about 13.5%. M+ was measured to be 733 by FD-MS. This mixture is a mixture of tris(2-(bromophenyl)pyridine)iridium (III) complex (complex 4), mono(2-(phenyl)pyridine)bis(2-(bromophenyl)pyridine)iridium (III) complex (complex 3), bis(2-(phenyl)pyridine)mono(2-(bromophenyl)pyridine)iridium (III) complex (complex 2), and tris(2-(phenyl)pyridine) iridium (III) complex (complex 1). The ratios of them measured by FD-MS are as shown in Table 1.

TABLE 1

| | FD-MS of complex | | |
|---|---|---|---|
| | Peak ratio | Composition (%) | Remarks |
| Complex 1 | 31 | 12.2 | Discharged out of the system without reaction |
| Complex 2 | 86 | 33.7 | Reacted to the end of a molecule |
| Complex 3 | 100 | 39.2 | |
| Complex 4 | 38 | 14.9 | |

Example 3

<Synthesis of Polymeric Light Emitting Substance 1>

0.403 g (0.735 mmol) of 9,9-dioctyl-2,7-dibromofluorene, 0.321 g (0.735 mmol) of N-octyl-3,6-dibromocarbazole, 0.022 g of bis(2-(phenyl)pyridine)mono(2-(bromophenyl) pyridine)iridium (III) (0.03 mmol: this mixtures is a mixture of a tris(2-(bromophenyl)pyridine)iridium (III) complex, mono(2-(phenyl)pyridine)bis(2-(bromophenyl)pyridine)iridium (III) complex, bis(2-(phenyl)pyridine)mono(2-(bromophenyl)pyridine)iridium (III) complex, and tris(2-(phenyl)pyridine)iridium (III) complex, and in charging, bis(2-(phenyl)pyridine)mono(2-(bromophenyl)pyridine)iridium (III) having a molecular weight of 733 was used) and 0.55 g (3.5 mmol) of 2,2'-bipyridyl were charged in a reaction vessel, then, the atmosphere in the reaction vessel was purged with a nitrogen gas. To this was added 40 ml of tetrahydrofuran (dehydrated solvent) previously degassed by bubbling of an argon gas. Then, to this mixed solution was added 0.96 g (3.5 mmol) of bis(1,5-cyclooctadiene)nickel (0), the resulted mixture was stirred for 10 minutes at room temperature, then, they were reacted for 8 hours at 60° C. The reaction was conducted under a nitrogen atmosphere. After the reaction, this solution was cooled, then, poured into a mixed solution of 10 ml of 25% ammonia water/150 ml of methanol/ 50 ml of ion exchanged water, and they were stirred for about 30 minutes. Then, the produced precipitate was filtrated and recovered. This precipitation was dried, then, dissolved in chloroform. This solution was filtrated to remove insoluble substances, then, this solution was poured into methanol, to cause re-precipitation, and the produced precipitation was recovered. This precipitation was dried under reduced pressure, to obtain 0.11 g of a polymer. This polymer is called polymeric light emitting substance 1.

The polymeric light emitting substance 1 had a polystyrene reduced weight-average molecular weight of $4.4 \times 10^5$ and a polystyrene reduced number-average molecular weight of $1.9 \times 10^5$.

The polymeric light emitting substance 1 is a copolymer containing 9,9-dioctyl-2,7-fluorene, N-octyl-3,6-carbazole and tris (2-(phenyl)pyridine)iridium (III) complex as repeating units.

Example 4

<Synthesis of Polymeric Light Emitting Substance 2>

0.403 g (0.735 mmol) of 9,9-dioctyl-2,7-dibromofluorene, 0.496 g (0.735 mmol) of N,N'-diphenyl-N,N'-bis(3-methyl-4-bromophenyl)benzidine, 0.022 g of bis (2-(phenyl)pyridine)mono (2-(bromophenyl)pyridine)iridium (III) (0.03 mmol: this mixtures is a mixture of a tris (2-(bromophenyl)pyridine) iridium (III) complex, mono (2-(phenyl)pyridine) bis (2-(bromophenyl)pyridine)iridium (III) complex, bis (2-(phenyl)pyridine)mono(2-(bromophenyl)pyridine) iridium (III) complex, and tris(2-(phenyl)pyridine)iridium (III) complex, and in charging, bis(2-(phenyl)pyridine)mono(2-(bromophenyl)pyridine)iridium (III) having a molecular weight of 733 was used) and 0.55 g (3.5 mmol) of 2,2'-bipyridyl were charged in a reaction vessel, then, the atmosphere in the reaction vessel was purged with a nitrogen gas. To this was added 40 ml of tetrahydrofuran (dehydrated solvent) previously degassed by bubbling of an argon gas. Then, to this mixed solution was added 0.96 g (3.5 mmol) of bis(1,5-cyclooctadiene)nickel (0), the resulted mixture was stirred for 10 minutes at room temperature, then, they were reacted for 8 hours at 60° C. The reaction was conducted under a nitrogen atmosphere. After the reaction, this solution was cooled, then, poured into a mixed solution of 10 ml of 25% ammonia water/150 ml of methanol/50 ml of ion exchanged water, and they were stirred for about 30 minutes. Then, the produced precipitate was filtrated and recovered. This precipitation was dried, then, dissolved in chloroform. This solution was filtrated to remove insoluble substances, then, this solution was poured into methanol, to cause re-precipitation, and the produced precipitation was recovered. This precipitation was dried under reduced pressure, to obtain 0.35 g of a polymer. This polymer is called polymeric light emitting substance 2.

The polymeric light emitting substance 2 had a polystyrene reduced weight-average molecular weight of $3.6 \times 10^5$ and a polystyrene reduced number-average molecular weight of $1.8 \times 10^4$.

The polymeric light emitting substance 2 is a copolymer containing 9,9-dioctyl-2,7-fluorene, N,N'-diphenyl-N,N'-bis (3-methylphenyl)benzidine and tris(2-(phenyl)pyridine)iridium (III) complex as repeating units.

Example 5

<Synthesis of Polymeric Light Emitting Substance 3>

0.806 g (1.47 mmol) of 9,9-dioctyl-2,7-dibromofluorene, 0.022 g of bis(2-(phenyl)pyridine)mono(2-(bromophenyl)pyridine)iridiu m (III) (0.03 mmol: this mixtures is a mixture of a tris(2-(bromophenyl)pyridine)iridium (III) complex, mono(2-(phenyl)pyridine)bis(2-(bromophenyl)pyridine)iridium (III) complex, bis(2-(phenyl)pyridine)mono(2-(bromophenyl)pyridine)iridium (III) complex, and tris(2-(phenyl)pyridine)iridium (III) complex, and in charging, bis(2-(phenyl)pyridine)mono(2-(bromophenyl)pyridine)iridium (III) having a molecular weight of 733 was used) and 0.55 g (3.5 mmol) of 2,2'-bipyridyl were charged in a reaction vessel, then, the atmosphere in the reaction vessel was purged with a nitrogen gas. To this was added 40 ml of tetrahydrofuran (dehydrated solvent) previously degassed by bubbling of an argon gas. Then, to this mixed solution was added 0.96 g (3.5 mmol) of bis (1,5-cyclooctadiene)nickel (0), the resulted mixture was stirred for 10 minutes at room temperature, then, they were reacted for 8 hours at 60° C. The reaction was conducted under a nitrogen atmosphere. After the reaction, this solution was cooled, then, poured into a mixed solution of 10 ml of 25% ammonia water/150 ml of methanol/50 ml of ion exchanged water, and they were stirred for about 30 minutes. Then, the produced precipitate was filtrated and recovered. This precipitation was dried, then, dissolved in chloroform. This solution was filtrated to remove insoluble substances, then, this solution was poured into methanol, to cause re-precipitation, and the produced precipitation was recovered. This precipitation was dried under reduced pressure, to obtain 0.11 g of a polymer. This polymer is called polymeric light emitting substance 3.

The polymeric light emitting substance 3 had a polystyrene reduced weight-average molecular weight of $7.6 \times 10^4$ and a polystyrene reduced number-average molecular weight of $1.2 \times 10^4$.

The polymeric light emitting substance 3 is a copolymer containing 9,9-dioctyl-2,7-fluorene, and tris(2-(phenyl)pyridine)iridium (III) complex as repeating units.

Example 6

<Polymer LED>

On a glass substrate carrying there on an ITO film adhered at a thickness of 150 nm by a sputtering method, a film was formed at a thickness of 50 nm by spin coat using a solution of poly(ethylenedioxythiophene)/polstyrenesulfonic acid (Baytron, manufactured by Bayer), and dried at 120° C. for 5 minutes on a hot plate. Then, a film was formed at a thickness of about 70 mm by spin coat using a 0.5 wt % solution of the polymeric light emitting substance 1 in chloroform. Further, this was dried at 80° C. under reduced pressure for 1 hour, then, lithium fluoride was deposited at a thickness of 0.4 nm as a cathode buffer layer, calcium was deposited at a thickness of 25 nm, then, aluminum was deposited at a thickness of 40 nm, as a cathode, to produce a polymer LED. The degree of vacuum in deposition was always 1 to $8 \times 10^{-6}$ Torr. By applying voltage on the resulted device, EL light emission from the polymeric light emitting substance 1 was obtained. The intensity of EL emission was approximately in proportion to current density.

Example 6

<Calculation Examples of Intersystem Crossing>

The structure of the minimum triplet excited state of a tris(2-phenylpyridine)iridium complex was analyzed by a B3LYP method using the LANL2 MB base function. Regarding the structure, the difference between energy between the minimum singlet excited state and the minimum triplet excited state was measured by a TDDFT method at B3LYP/LANL2 MB level, to find it was 0.87 eV. For the calculation, Caussian 98 program was used.

The polymeric light emitting substance of the present invention has a complex emitting triplet luminescence structure in the molecule, and can form a light emitting layer by industrially simple application methods such as a spin coat method, inkjet method, printing method and the like. Further, the polymeric light emitting substance of the present invention contains a complex emitting triplet luminescence, and can manifest high light emitting efficiency. Therefore, the polymeric light emitting substance of the present invention can be used suitably as a light emitting material of a polymer LED, and the like. According to the production method of the present invention, this polymeric light emitting substance can be produced easily. The polymer LED of the present invention can be preferably used in apparatuses such as a back light of a liquid crystal display, light sources in the form of curve or flat plate for illumination, display elements of segment type, flat panel displays of dot matrix, and the like.

What is claimed is:

1. A polymeric light emitting substance having a polystyrene reduced number-average molecular weight of from $10^3$ to $10^8$ wherein said light emitting substance has a metal complex structure showing light emission from the triplet excited state at least at one of the ends of the main chain, wherein the main chain comprises a conjugated polymer, and the metal complex structure is represented by the below formula (6):

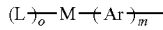  (6)

wherein M represents a metal atom having an atomic number of 50 or more and showing a possibility of the inter-system crossing between the singlet state and the triplet state in this complex by a spin-orbital mutual action; Ar represents a ligand bonded to M, via one or more of a nitrogen atom, an oxygen atom, a carbon atom, a sulfur atom and a phosphorus atom, with bonding to a polymer at an arbitrary bonding position of the ligand; L represents a hydrogen atom, a hydrocarbon group having 1 to 10 carbon atoms, a carboxylate group having 1 to 10 carbon atoms, a diketonate group having 1 to 10 carbon atoms, a halogen atom, an amide group, an imide group, an alkoxide group, an alkylmercapto group, a carbonyl ligand, an arylene ligand, an alkene ligand, an alkyne ligand, an amine ligand, an imine ligand, a nitrile ligand, an isonitrile ligand, a phosphine ligand, a phosphine oxide ligand, a phosphite ligand, an ether ligand, a sulfone ligand, a sulfoxide ligand, a sulfide ligand or a heterocyclic compound group; m represents an integer of 1 to 5; and o represents an integer of 0 to 5, wherein M is a rhenium atom, osmium atom, iridium atom, platinum atom or gold atom, wherein the polymeric light emitting substance comprises one or more repeating units selected from the group consisting of the general formulas (1), (2) and (5) and one or more repeating units having a metal complex structure showing light emission from the triplet excited state, and the amount of the repeating units having a metal complex structure showing light emission from the triplet excited state is 0.01 mol % or more and 10 mol % or less based on the total amount of the repeating units of the general formulas (1), (2) and (5) and the repeating units having a metal complex structures showing light emission from the triplet excited state,

  (1)

wherein $Ar_1$ represents an arylene group or a divalent heterocyclic compound group; $R_1$ and $R_2$ each independently represent a hydrogen atom, an alkyl group, an aryl group, a monovalent heterocyclic compound group or a cyano group; and n represents 0 or 1;

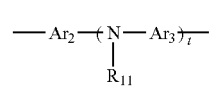  (2)

wherein $Ar_2$ and $Ar_3$ each independently represents an arylene group, or a divalent heterocyclic compound group; $Ar_2$ does not cross-link to $Ar_3$; $R_{11}$ represents an alkyl group, an aryl group, a mono-valent heterocyclic compound group, or a group represented by the below formula (3) or (4); the symbol t is an integer from 1 to 4;

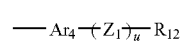  (3)

wherein $Ar_4$ is an arylene group or a divalent heterocyclic compound group; $R_{12}$ represents a hydrogen atom, an alkyl group, an aryl group, a mono-valent heterocyclic group, or a group represented by the below formula (4); $Z_1$ represents $-CR_{13}=CR_{14}-$ or $-C\equiv C-$; $R_{13}$ and $R_{14}$ each independently represents a hydrogen atom, an alkyl group, an aryl group, a mono-valent heterocyclic group, or a cyano group; the symbol u is an integer from 0 to 2;

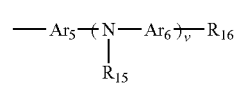  (4)

wherein $Ar_5$ and $Ar_6$ each independently represents an arylene group or a divalent heterocyclic compound group; $R_{15}$ represents an alkyl group, an aryl group, or a mono-valent heterocyclic group; and the symbol v is an integer from 1 to 4;

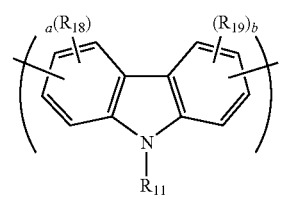  (5)

wherein $R_{11}$ means the same as above; $R_{18}$ and $R_{19}$ each independently represents substituents on aromatic ring of a halogen atom, an alkyl group, an alkenyl group, an aralkyl group, an arylthio group, an arylalkenyl group, a cyclic alkenyl group, an alkoxy group, an aryloxy group, an alkyloxy carbonyl group, an aralkyloxy carbonyl group, an aryloxy carbonyl group, an aryl group, or a mono-valent heterocyclic group; the symbols a and b each independently represent an integer from 0 to 3; and when a or b is 2 or more, $R_{18}$ and $R_{19}$ are the same or different mutually, which may be connected to form a ring.

2. The polymeric light emitting substance according to claim 1, wherein said light emitting substance has two or more kinds of the metal complex structure showing light emission from the triplet excited state.

3. The polymeric light emitting substance according to claim 1, wherein at least one ligand contained in the metal complex structure comprises the same structure with a repeating unit contained in the main chain.

4. The polymeric light emitting substance according to claim 1, comprising one or more repeating units of the general formula (1) and one or more repeating units having a metal complex structure showing light emission from the triplet excited state:

(1)

wherein $Ar_1$ represents an arylene group or a divalent heterocyclic compound group; $R_1$ and $R_2$ each independently represents a hydrogen atom, an alkyl group, an aryl group, a monovalent heterocyclic compound group or a cyano group; and n represents 0 or 1.

5. The polymeric light emitting substance according to claim 1, comprising one or more repeating units of the formula (2),

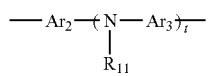
(2)

wherein $Ar_2$ and $Ar_3$ each independently represents an arylene group, or a divalent heterocyclic compound group; $Ar_2$ does not cross-link to $Ar_3$; $R_{11}$ represents an alkyl group, an aryl group, a mono-valent heterocyclic compound group, or a group represented by the below formula (3) or (4); the symbol t is an integer from 1 to 4;

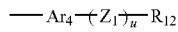
(3)

wherein $Ar_4$ is an arylene group or a divalent heterocyclic compound group; $R_{12}$ represents a hydrogen atom, an alkyl group, an aryl group, a mono-valent heterocyclic group, or a group represented by the below formula (4); $Z_1$ represents $—CR_{13}\!=\!CR_{14}—$ or $—C\!\equiv\!C—$; $R_{13}$ and $R_{14}$ each independently represents a hydrogen atom, an alkyl group, an aryl group, a mono-valent heterocyclic group, or a cyano group; the symbol u is an integer from 0 to 2;

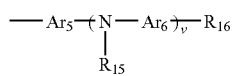
(4)

wherein $Ar_5$ and $Ar_6$ each independently represents an arylene group or a divalent heterocyclic compound group; $R_{15}$ represents an alkyl group, an aryl group, or a mono-valent heterocyclic group; and the symbol v is an integer from 1 to 4.

6. The polymeric light emitting substance according to claim 4, comprising one or more repeating units of the formula (5),

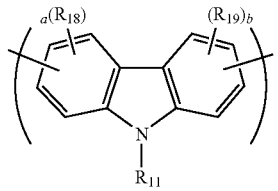
(5)

wherein $R_{11}$ means the same as above; $R_{18}$ and $R_{19}$ each independently represents substituents on aromatic ring of a halogen atom, an alkyl group, an alkenyl group, an aralkyl group, an arylthio group, an arylalkenyl group, a cyclic alkenyl group, an alkoxy group, an aryloxy group, an alkyloxy carbonyl group, an aralkyloxy carbonyl group, an aryloxy carbonyl group, an aryl group, or a mono-valent heterocyclic group; the symbols a and b each independently represent an integer from 0 to 3; and when a or b is 2 or more, $R_{18}$ and $R_{19}$ are the same or different mutually, which may be connected to form a ring.

7. The polymeric light emitting substance according to claim 1, wherein M bonds to at least one carbon atom.

8. The polymeric light emitting substance according to claim 1, wherein Ar represents a bidentate ligand forming a 5 membered ring by bonding to M, via a nitrogen atom, an oxygen atom, a carbon atom, a sulfur atom or a phosphor atom.

9. The polymeric light emitting substance according to claim 1, wherein Ar represents a bidentate ligand represented by the formula (7),

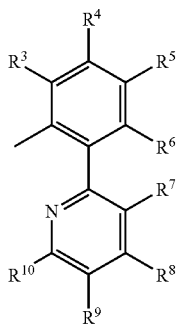
(7)

wherein $R^3$ to $R^{10}$ each independently represents a halogen atom, an alkyl group, an alkenyl group, an aralkyl group, an arylthio group, an arylalkenyl group, a cyclic alkenyl group, an alkoxy group, an aryloxy group, an alkyloxy carbonyl group, an aralkyloxy carbonyl group, an aryloxy carbonyl group, or an aryl group; and at least one of $R^3$ to $R^{10}$ is a bonding group to a polymer chain.

10. A method for producing a polymeric light emitting substance of claim 4, comprising reacting a monomer of $X_1$-A-$X_2$ with $X_3$—$Ar_1$—$X_4$ in the presence of a Ni catalyst, wherein, $X_1$ and $X_2$ each independently represent a halogen atom, alkylsulfonyloxy group or arylsulfonyloxy group; -A- represents a repeating unit having a metal complex structure showing light emission from the triplet excited state; $X_3$ and $X_4$ each independently represent a halogen atom, alkylsulfonyloxy group or arylsulfonyloxy group.

11. A method for producing a polymeric light emitting substance of claim 4, comprising reacting a monomer of $Y_1$-A-$Y_2$ with a monomer of $Z_1$—Ar—$Z_2$ in the presence of a Pd catalyst, wherein $Y_1$ and $Y_2$ each independently represent a boric acid group or borate group;

and $Z_1$ and $Z_2$ represent a halogen atom, alkylsulfonyloxy group or arylsulfonyloxy group.

12. A method for producing a polymeric light emitting substance of claim 4, comprising reacting a monomer of $Y_3$—$Ar_1$—$Y_4$ with a monomer of $Z_3$-A-$Z_4$ in the presence of a Pd catalyst, wherein $Y_3$ and $Y_4$ each independently represent a boric acid group or borate group; and $Z_3$ and $Z_4$ each independently represent a halogen atom, alkylsulfonyloxy group or arylsulfonyloxy group.

13. A polymer light emitting device comprising at least a light emitting layer between a pair of electrodes composed of an anode and a cathode at least one of which is transparent or semi-transparent wherein the light emitting layer comprises a polymeric light emitting substance according to claim 4.

14. A flat light source comprising a polymer light emitting device according to claim 13.

15. A segment display comprising a polymer light emitting device according to claim 13.

16. A dot matrix display comprising a polymer light emitting device according to claim 13.

17. A liquid crystal display comprising a polymer light emitting device according to claim 13 as a back-light.

18. The polymeric light emitting substance according to claim 1, wherein M is an iridium atom, platinum atom or gold atom.

* * * * *